(12) United States Patent
Hayashi et al.

(10) Patent No.: US 11,935,731 B2
(45) Date of Patent: Mar. 19, 2024

(54) PLASMA PROCESSING APPARATUS, PLASMA STATE DETECTION METHOD, AND PLASMA STATE DETECTION PROGRAM

(71) Applicant: TOKYO ELECTRON LIMITED, Tokyo (JP)

(72) Inventors: Daisuke Hayashi, Miyagi (JP); Yoshihiro Umezawa, Miyagi (JP); Shinsuke Oka, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 662 days.

(21) Appl. No.: 16/978,134

(22) PCT Filed: Jun. 17, 2019

(86) PCT No.: PCT/JP2019/023793
§ 371 (c)(1),
(2) Date: Sep. 3, 2020

(87) PCT Pub. No.: WO2020/004091
PCT Pub. Date: Jan. 2, 2020

(65) Prior Publication Data
US 2021/0020418 A1   Jan. 21, 2021

(30) Foreign Application Priority Data

Jun. 29, 2018 (JP) .................... 2018-124896
Feb. 25, 2019 (JP) .................... 2019-032013
May 28, 2019 (JP) .................... 2019-099609

(51) Int. Cl.
*H01J 37/32* (2006.01)
*G05D 23/19* (2006.01)
(Continued)

(52) U.S. Cl.
CPC .... *H01J 37/32935* (2013.01); *G05D 23/1917* (2013.01); *G05D 23/193* (2013.01);
(Continued)

(58) Field of Classification Search
None
See application file for complete search history.

(56) References Cited

U.S. PATENT DOCUMENTS

2004/0235304 A1* 11/2004 Oh .................... H01J 37/32935
                                                                     438/689
2008/0170969 A1*  7/2008 Yoshioka ............... G05D 23/22
                                                                      422/109
(Continued)

FOREIGN PATENT DOCUMENTS

JP   H08-83776 A    3/1996
JP   2009-87790 A   4/2009
(Continued)

*Primary Examiner* — Ram N Kackar
*Assistant Examiner* — Laureen Chan
(74) *Attorney, Agent, or Firm* — Nath, Goldberg & Meyer; Jerald L. Meyer; Tanya E. Harkins

(57) ABSTRACT

A measurement part controls power supplied to a heater such that a temperature of the heater becomes constant by using a heater controller, and measures the supplied power in an unignited state in which plasma is not ignited and a transient state in which the power supplied to the heater decreases after plasma is ignited. A parameter calculator performs fitting on a calculation model, which includes a heat input amount from the plasma as a parameter, for calculating the power supplied in the transient state by using the power supplied in the unignited state and the transient state and measured by the measurement part, and calculates the heat input amount. An output part configured to output information based on the heat input amount calculated by the parameter calculator.

12 Claims, 15 Drawing Sheets

(51) Int. Cl.
*G08B 21/18* (2006.01)
*H05B 1/02* (2006.01)
(52) U.S. Cl.
CPC ........ *G08B 21/18* (2013.01); *H01J 37/32724* (2013.01); *H01J 37/32926* (2013.01); *H01J 37/32944* (2013.01); *H01J 37/3299* (2013.01); *H05B 1/023* (2013.01); *H05B 1/0233* (2013.01); *H01J 2237/24585* (2013.01); *H01J 2237/334* (2013.01); *H05B 2203/005* (2013.01)

(56) References Cited

U.S. PATENT DOCUMENTS

2011/0143462 A1* 6/2011 Gaff ........................ H01J 37/20
　　　　　　　　　　　　　　　　　　　　　　257/E21.53
2016/0378092 A1* 12/2016 Yamamoto .......... H01L 21/6831
　　　　　　　　　　　　　　　　　　　　　　700/300

FOREIGN PATENT DOCUMENTS

| JP | 2009-194032 A | 8/2009 |
| JP | 2014-513390 A | 5/2014 |
| JP | 2015-92580 A | 5/2015 |

\* cited by examiner

PLASMA PROCESSING APPARATUS, PLASMA STATE DETECTION METHOD, AND PLASMA STATE DETECTION PROGRAM

This is a National Phase Application filed under 35 U.S.C. 371 as a national stage of PCT/JP2019/023793, filed Jun. 17, 2019, an application claiming the benefit of Japanese Application No. 2018-124896, filed Jun. 29, 2018, Japanese Application No. 2019-032013, filed Feb. 25, 2019 and Japanese Application No. 2019-099609, filed May 28, 2019 the content of each of which is hereby incorporated by reference in its entirety.

TECHNICAL FIELD

The present disclosure relates to a plasma processing device, a plasma state detection method, and a plasma state detection program.

BACKGROUND

There is known a plasma processing apparatus that performs a plasma processing such as an etching process on a workpiece such as a semiconductor wafer (hereinafter, also referred to as a "wafer") by using plasma. With respect to the plasma processing apparatus, there is proposed a technique in which sensors such as various probes and electric sensors are arranged in a processing container so as to detect a state of plasma.

PRIOR ART DOCUMENTS

Patent Documents

Patent Document 1: Japanese laid-open publication No. 2009-194032
Patent Document 2: Japanese laid-open publication No. 2009-087790
Patent Document 3: Japanese laid-open publication No. 2014-513390

SUMMARY

The present disclosure provides a technique for detecting a state of plasma without disposing a sensor.

A plasma processing apparatus according to an aspect of the present disclosure includes a stage, a heater controller, a measurement part, a parameter calculator, and an output part. The stage is provided with a heater configured to adjust a temperature of a mounting surface on which a workpiece as an object to be plasma-processed is placed. The heater controller is configured to control power supplied to the heater such that the heater has a set temperature.

The measurement part is configured to control power supplied to the heater such that a temperature of the heater becomes constant by using the heater controller, and is configured to measure the supplied power in an unignited state in which plasma is not ignited and a transient state in which the power supplied to the heater decreases after plasma is ignited. The parameter calculator is configured to perform fitting on a calculation model, which includes a heat input amount from the plasma as a parameter, for calculating the power supplied in the transient state by using the power supplied in the unignited state and the transient state and measured by the measurement part, and is configured to calculate the heat input amount. The output part is configured to output information based on the heat input amount calculated by the parameter calculator.

According to the present disclosure, it is possible to detect a state of plasma without disposing a sensor in the processing container.

DETAILED DESCRIPTION

Hereinafter, embodiments of a plasma processing apparatus, a plasma state detection method, and a plasma state detection program disclosed in the present application will be described in detail with reference to the drawings. The plasma processing apparatus, plasma state detection method, and plasma state detection program disclosed herein are not limited to the embodiments.

For example, a plasma processing apparatus may include sensors such as various probes and electric sensors arranged in a processing container thereof so as to detect a state of plasma. However, when the sensors are arranged in the processing container, in particular at a place near a plasma generation region, the state of plasma changes due to influence of the sensors. Thus, there is a concern that characteristics and uniformity of the plasma processing on a film to be processed in the plasma processing apparatus may be affected. Further, there is a concern a particles or abnormal discharge may occur in the plasma processing apparatus. In addition, when the sensors are arranged in the processing container, it may be impossible to perform the plasma processing on the film to be processed in the plasma processing apparatus. In the cases described above, the plasma processing apparatus cannot detect the state of the plasma during an actual execution period of the plasma processing. Therefore, it is necessary to detect a state of plasma without disposing a sensor the processing container.

[Configuration of Plasma Processing Apparatus]

Figure 1:
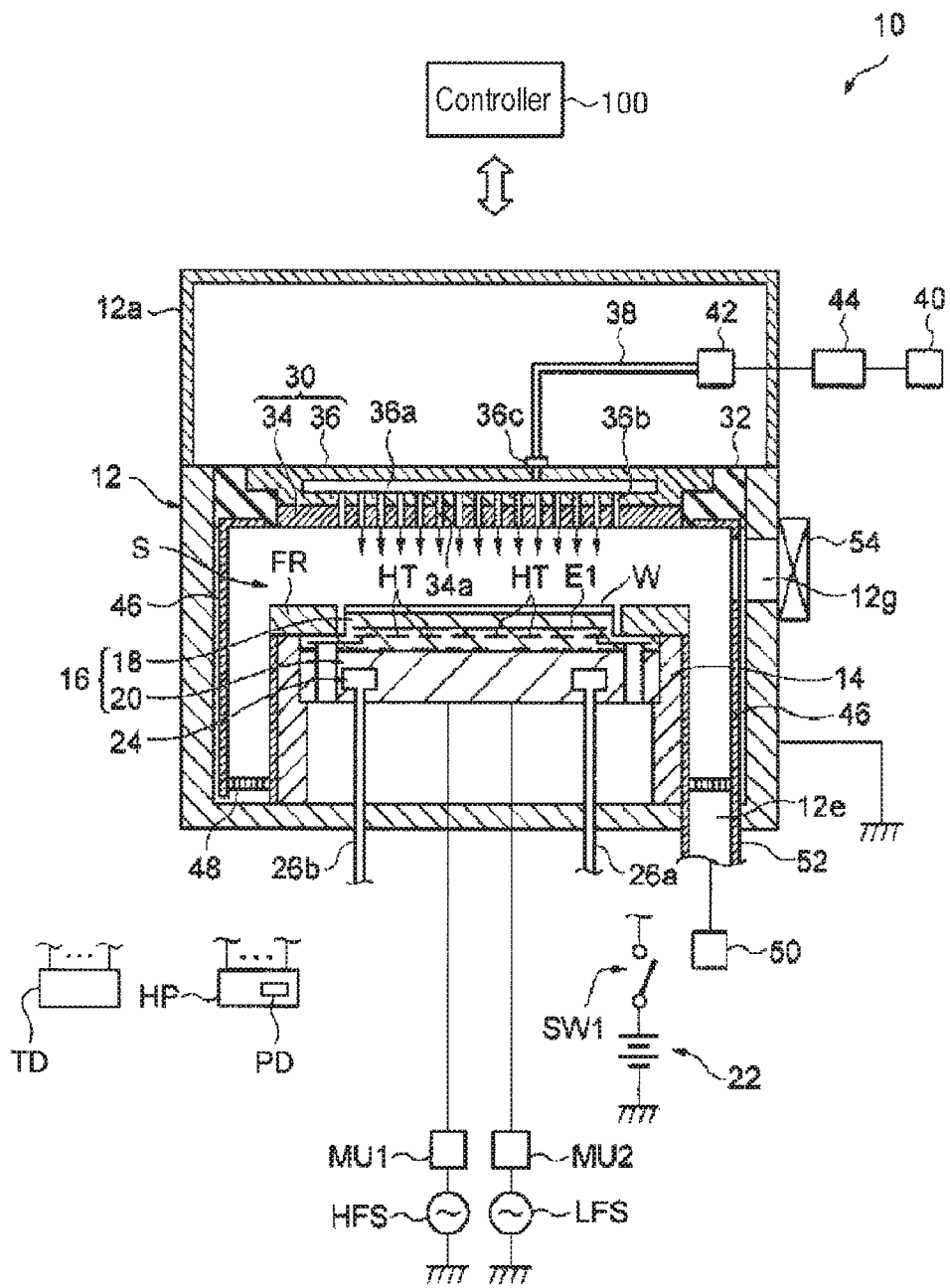
FIG. 1 is a cross-sectional view schematically illustrating an exemplary configuration of a plasma processing apparatus according to an embodiment.

First, configuration of a plasma processing apparatus 10 according to an embodiment will be described. FIG. 1 is a cross-sectional view schematically illustrating an exemplary configuration of a plasma processing apparatus according to an embodiment. The plasma processing apparatus 10 illustrated in FIG. 1 is a capacitively coupled parallel plate plasma etching apparatus. The plasma processing apparatus 10 includes a substantially cylindrical processing container 12. The processing container 12 is formed of, for example, aluminum. In addition, the surface of the processing container 12 is anodized.

A stage 16 is provided in the processing container 12. The stage 16 includes an electrostatic chuck 18 and a base 20. The top surface of the electrostatic chuck 18 serves as a mounting surface on which a workpiece as an object to be plasma-processed is placed. In the present embodiment, a wafer W as the workpiece is placed on the top surface of the electrostatic chuck 18. The base 20 is substantially disk-shaped, and has a main portion formed of a conductive metal such as aluminum. The base 20 constitutes a lower electrode. The base 20 is supported by a support 14. The support 14 is a cylindrical member extending from a bottom portion of the processing container 12.

A first high-frequency power supply HFS is electrically connected to the base 20, The first high-frequency power supply HFS is a power supply configured to generate high-frequency power for plasma generation, and generates high-frequency power having a frequency of 27 MHz to 100 MHz (e.g., 40 MHz). Accordingly, plasma is generated just above the base 20. A matcher MU1 has a circuit configured to match an output impedance of the first high-frequency power supply HFS and an input impedance on a load side (a side of the base 20).

A second high-frequency power supply LFS is electrically connected to the base 20 via a matcher MU2. The second high-frequency power supply LFS generates high-frequency power (high-frequency bias power) for drawing ions into the wafer W, and supplies the high-frequency bias power to the base 20. Accordingly, a bias potential is generated on the base 20. The frequency of the high-frequency bias power ranges from 400 kHz to 13.56 MHz (e.g., 3 MHz). The matcher MU2 has a circuit configured to match an output impedance of the second high-frequency power supply LFS and the input impedance on the load side (the side of the base 20).

The electrostatic chuck 18 is provided on the base 20. The electrostatic chuck 18 attracts the water W by an electrostatic force such as Coulomb force so as to hold the water W. The electrostatic chuck 18 has an electrode E1 for electrostatic attraction in a ceramic body thereof. A DC power supply 22 is electrically connected to the electrode E1 via a switch SW1. The attraction force for holding the wafer W depends on a value of a DC voltage applied from the DC power supply 22.

A focus ring FR is provided on the top surface of the base 20 and around the electrostatic chuck 18. The focus ring FR is provided in order to improve uniformity of the plasma processing. The focus ring FR is formed of a material appropriately selected depending on the plasma processing to be executed, and may be formed of, for example, silicon or quartz.

Inside the base 20, a coolant flow path 24 is formed. A coolant is supplied to the coolant flow path 24 from a chiller unit provided outside the processing container 12 via a pipe 26a. The coolant supplied to the coolant flow path 24 returns to the chiller unit via a pipe 26b. Details of the stage 16 including the base 20 and the electrostatic chuck 18 will be described later.

An upper electrode 30 is provided in the processing container 12. The upper electrode 30 is disposed above the stage 16 and faces the base 20. The base 20 and the upper electrode 30 are provided substantially parallel to each other.

The upper electrode 30 is supported in an upper portion of the processing container 12 via an insulating shield member 32. The upper electrode 30 may include an electrode plate 34 and an electrode support 36. The electrode plate 34 faces a processing space S and provides a plurality of gas ejection ports 34a. The electrode plate 34 may be formed of a low-resistance conductor or a semiconductor with a low Joule heat.

The electrode support 36 detachably supports the electrode plate 34, and may be formed of conductive material such as aluminum. The electrode support 36 may have a water-cooling structure. Inside the electrode support 36, a gas diffusion chamber 36a is provided. A plurality of gas discharge holes 36b in communication with the gas ejection ports 34a extend downwards from the gas diffusion chamber 36a. In addition, the electrode support 36 is provided with a gas inlet 36c configured to guide a processing gas to the gas diffusion chamber 36a, and a gas supply pipe 38 is connected to the gas inlet 36c.

A gas source group 40 is connected to the gas supply pipe 38 via a valve group 42 and a flow rate controller group 44. The valve group 42 includes a plurality of opening and closing valves, and the flow rate controller group 44 includes a plurality of flow rate controllers such as mass flow controllers. In addition, the gas source group 40 has gas sources for multiple types of gases required for the plasma processing. The gas sources of the gas source group 40 are connected to the gas supply pipe 38 via corresponding opening and closing valves and corresponding mass flow controllers.

In the plasma processing apparatus 10, one or more gases selected from the plurality of gas sources of the gas source group 40 are supplied to the gas supply pipe 38. The gases supplied to the gas supply pipe 38 reach the gas diffusion chamber 36a and are ejected into the processing space S through the gas discharge holes 36b and the gas ejection ports 34a.

As illustrated in FIG. 1, the plasma processing apparatus 10 may further include a ground conductor 12a. The ground conductor 12a is a substantially cylindrical ground conductor, and is provided so as to extend from the side wall of the processing chamber 12 to a location above a height position of the upper electrode 30.

In the plasma processing apparatus 10, a deposition shield 46 is detachably provided along the inner wall of the processing container 12. The deposition shield 46 is also provided on the outer periphery of the support 14. The deposition shield 46 prevents an etching byproduct (deposition) from adhering to the processing container 12, and may be configured by coating an aluminum material with ceramic such as $Y_2O_3$.

On the bottom side of the processing container 12, an exhaust plate 48 is provided between the support 14 and the inner wall of the processing container 12. The exhaust plate 48 may be configured by coating, for example, an aluminum material with ceramic such as $Y_2O_3$. An exhaust port 12e is provided below the exhaust plate 48 in the processing container 12. An exhaust device 50 is connected to the exhaust port 12e via an exhaust pipe 52. The exhaust device 50 has a vacuum pump such as a turbo molecular pump, and is capable of depressurizing the interior of the processing container 12 to a desired degree of vacuum. A loading and unloading port 12g for the wafer W is provided in the sidewall of the processing container 12, and the loading and unloading port 12g is configured to be capable of being opened and closed by a gate valve 54.

The plasma processing apparatus 10 configured as described above is generally controlled by a controller 100. The controller 100 is, for example, a computer, and controls respective components of the plasma processing apparatus 10. Operation of the plasma processing apparatus 10 is generally controlled by the controller 100.

[Configuration of Stage]

Figure 2:
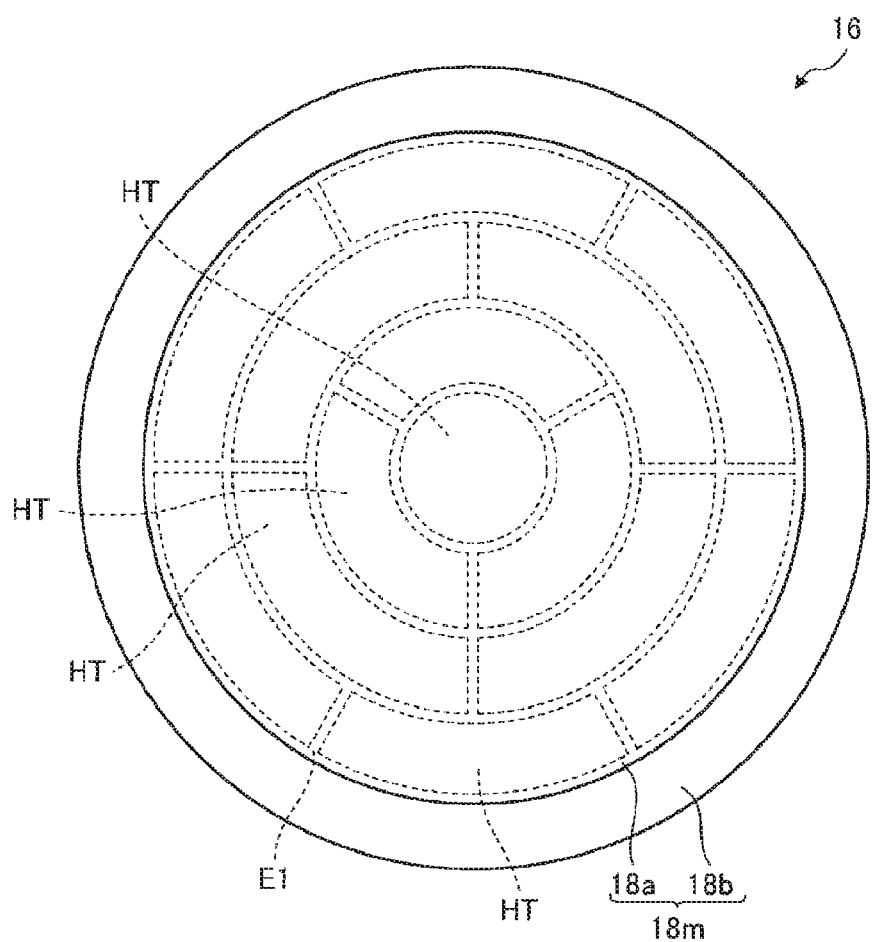
FIG. 2 is a plan view illustrating an exemplary configuration of a stage according to an embodiment.

Next, the stage 16 will be described in more detail. FIG. 2 is a plan view illustrating an exemplary configuration of a stage according to an embodiment. As described above, the stage 16 includes the electrostatic chuck 18 and the base 20. The electrostatic chuck 18 includes a ceramic body 18m. The body 18m is substantially disk-shaped. The body 18m provides a mounting region 18a and an outer peripheral region 18b. The mounting region 18a is a region having a substantially circular shape when viewed in a plan view. The wafer W is placed on the top surface of the mounting region 18a. That is to say, the top surface of the mounting region 18a functions as a mounting surface on which the wafer W is mounted. A diameter of the mounting region 18a is substantially the same as a diameter of the wafer W or slightly smaller than the diameter of the wafer W. The outer peripheral region 18b is a region surrounding the mounting region 18a and extends substantially in an annular shape. In the present embodiment, the top surface of the outer peripheral region 18b is located below the top surface of the mounting region 18a.

As illustrated in FIG. 2, the electrostatic chuck 18 has the electrode E1 for electrostatic attraction in the mounting region 18a. As described above, the electrode E1 is connected to the DC power supply 22 via the switch SW1.

A plurality of heaters HT are provided below the electrode E1 in the mounting region 18a. In the present embodiment, the mounting region 18a is divided into a plurality of division regions, and a heater HT is provided in each of the division regions. For example, as illustrated in FIG. 2, a plurality of heaters HT are provided in a circular region at the center of the mounting region 18a and a plurality of concentric annular regions surrounding the circular region. In each of the plurality of annular regions, a plurality of heaters HI are arranged in a circumferential direction. A method of dividing the division regions illustrated in FIG. 2 is merely an example, and is not limited thereto. The mounting region 18a may be divided into more division regions. For example, the mounting region 18a may be divided into division regions, which have reduced angular widths and reduced radial widths as it goes to the outer periphery of the mounting region 18a. The heaters HT are individually connected to a heater power supply HP illustrated in FIG. 1 via a wire (not illustrated) provided on an outer peripheral portion of the base 20. The heater power supply HP supplies individually adjusted power to each heater HT under a control of the controller 100. Thus, heat generated by each heater HT is individually controlled, and temperatures of the plurality of division regions in the mounting region 18a are individually adjusted.

The heater power supply HP is provided with a power detector PD configured to detect power supplied to each heater HT. The power detector PD may be provided separately from the heater power supply HP, and may be provided in a wire through which power flows from the heater power supply HP to each heater HT. The power detector PD detects power supplied to each heater HT. For example, the power detector PD detects electric energy [W] as the power supplied to each heater HT. The heater HT generates heat depending on the electric energy. Therefore, the electric energy supplied to the heater HT represents heater power. The power detector PD notifies the controller 100 of power data indicating the detected power supplied to each heater HT.

In the stage 16, a temperature sensor (not illustrated) capable of detecting the temperature of each heater HT is provided in each division region of the mounting region 18a. The temperature sensor may be an element capable of measuring the temperature, separately from the heater HT. In addition, the temperature sensor is disposed in a wire through which power supplied to the heater HT flows, and may detect a temperature from a resistance value obtained by measuring a voltage and current applied to the heater HT by using the fact that an electric resistance of a main metal increases in proportion to a temperature rising. A sensor value detected by each temperature sensor is sent to a temperature measurement device TD. The temperature measurement device TD measures a temperature of each division region of the mounting region 18a based on each sensor value. The temperature measurement device TD notifies the controller 100 of temperature data indicating the temperature of each division region of the mounting region 18a.

In addition, a heat transfer gas (e.g., a He gas) may be supplied to a space between the top surface of the electrostatic chuck 18 and the rear surface of the wafer W by a heat transfer gas supply mechanism and a gas supply line (not illustrated).

[Configuration of Controller]

Figure 3:
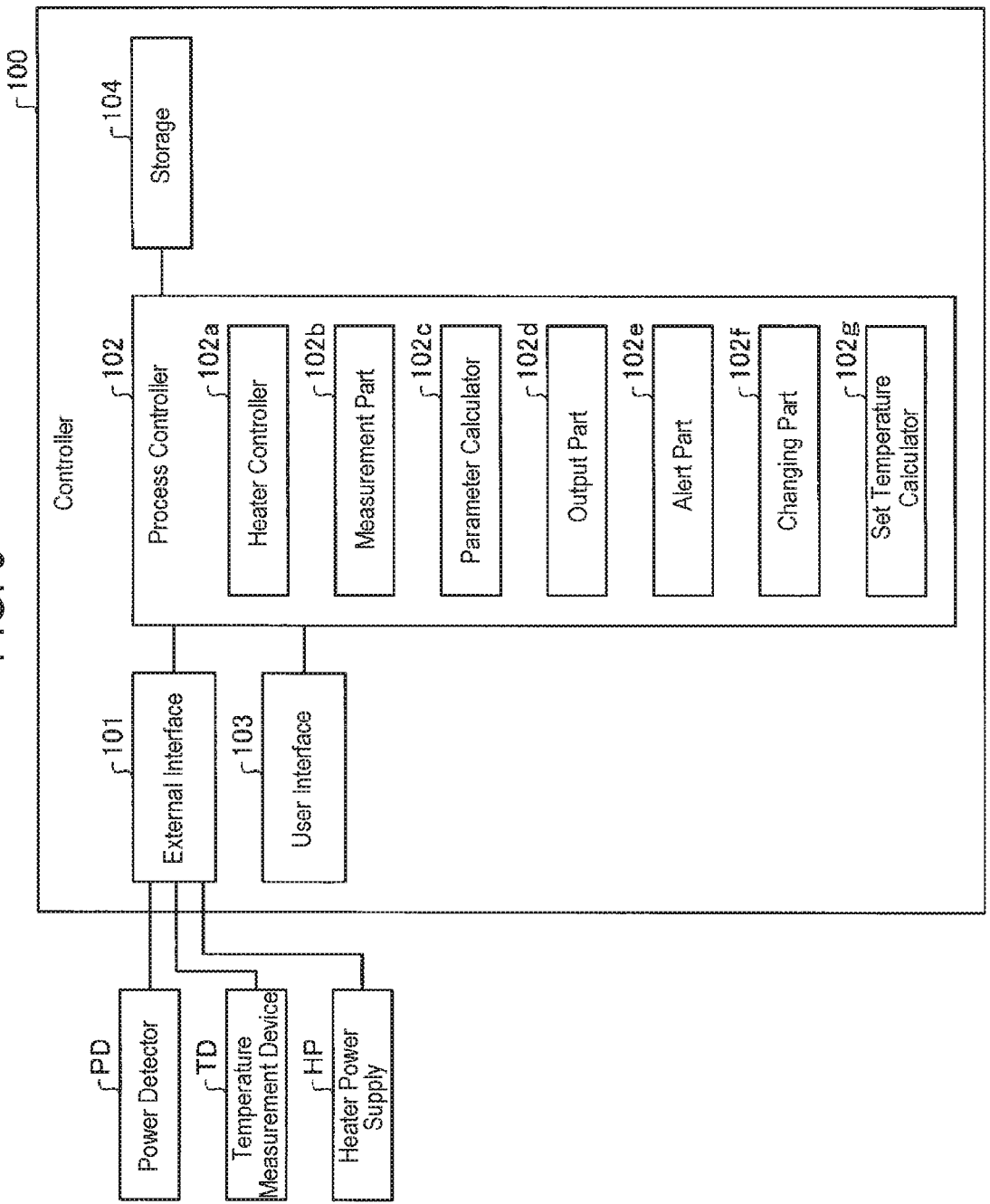
FIG. 3 is a block diagram schematically illustrating an exemplary configuration of a controller that controls a plasma processing apparatus according to an embodiment.

Next, the controller 100 will be described in detail. FIG. 3 is a block diagram schematically illustrating an exemplary configuration of a controller that controls a plasma processing apparatus according to an embodiment. The controller 100 includes an external interface 101, a process controller 102, a user interface 103, and a storage 104.

The external interface 101 is capable of communicating with respective components of the plasma processing apparatus 10, and inputs and outputs various kinds of data. For example, power data indicating the power supplied from the power detector PD to each heater HT is input to the external interface 101. In addition, temperature data indicating the temperature of each division region of the mounting region 18a is input from the temperature measurement device TD to the external interface 101. Further, the external interface 101 outputs control data for controlling the power supplied to each heater HT to the heater power supply HP.

The process controller 102 includes a central processing unit (CPU) so as to control respective components of the plasma processing apparatus 10.

The user interface 103 includes, for example, a keyboard through which a process manager inputs commands for managing the plasma processing apparatus 10, and a display configured to visualize and display the operation situation of the plasma processing apparatus 10.

The storage 104 stores, for example, a control program (software) for implementing various processes executed in the plasma processing apparatus 10 under a control of the process controller 102, a recipe storing process condition data and the like, and parameters associated with devices and processes in performing the plasma processing. In addition, the control program and the recipe of processing condition data and the like may be used in a state of being stored in a computer storage medium (e.g., an optical disc such as a hard disc or a DVD, a flexible disc, or semiconductor memory) that is capable of being read by a computer. In addition, the recipe may be used online by being transmitted from other device at any time via, for example, a dedicated line.

The process controller 102 includes an internal memory that stores programs or data, and reads the control program stored in the storage 104 to execute a processing of the read control program. The process controller 102 functions as various processing parts when the control program operates. For example, the process controller 102 has functions of a heater controller 102a, a measurement part 102b, a parameter calculator 102c, an output part 102d, an alert part 102e, a changing part 102f, and a set temperature calculator 102g. The respective functions of the heater controller 102a, the measurement part 102b, the parameter calculator 102c, the output part 102d, the alert part 102e, the changing part 102f, and the set temperature calculator 102g may be implemented by a plurality of controllers in a distributed manner.

Figure 4:
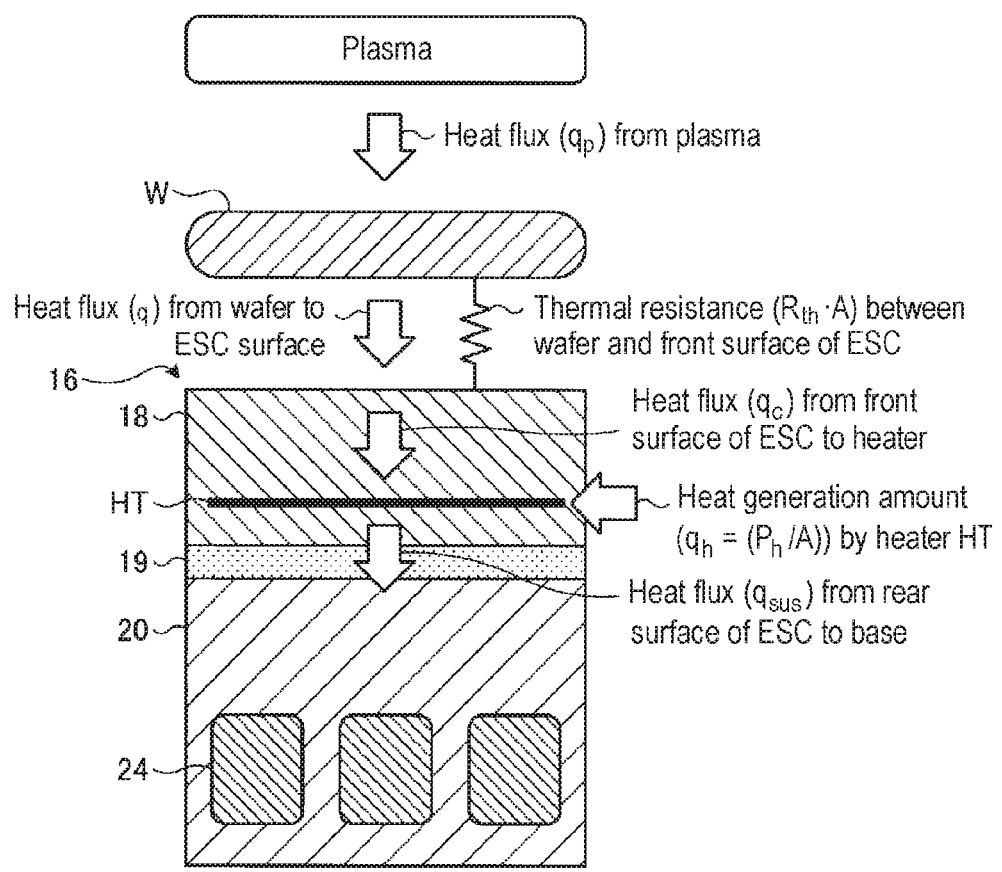
FIG. 4 is a view schematically illustrating an exemplary flow of energy that affects a temperature of a wafer.

Here, a flow of energy affecting the temperature of the wafer W will be described. FIG. 4 is a view schematically illustrating an exemplary flow of energy that affects the temperature of a wafer, in FIG. 4, the wafer W and the stage 16 including the electrostatic chuck (ESC) 18 are illustrated in a simplified manner. The example of FIG. 4 illustrates a flow of energy affecting the temperature of the wafer W for one division region in the mounting region 18a of the electrostatic chuck 18. The stage 16 includes the electrostatic chuck 18 and the base 20. The electrostatic chuck 18 and the base 20 are bonded to each other by an adhesive layer 19. The heater HT is provided inside the mounting region 18a of the electrostatic chuck 18. The coolant flow path 24 through which a coolant flows is formed inside the base 20.

The heater HT generates heat depending on the power supplied from the heater power supply HP, and the temperature of the heater HT rises. In FIG. 4, the power supplied to the heater HT is represented as heater power $P_h$. The heater HT generates a heat generation amount (heat flux) per unit area $q_h$ obtained by dividing the heater power $P_h$ by an area A of a region where the heater HT of the electrostatic chuck 18 is provided.

In addition, when the plasma processing is being performed, the temperature of the wafer W rises due to the heat input from the plasma. FIG. 4 represents a heat flux from the plasma per unit area $q_p$, which is obtained by dividing the amount of heat input from the plasma to the wafer W by an area of the wafer W.

It is known that a heat input from plasma is proportional to a product of an amount of ions in the plasma mainly radiated to the water W and a bias potential for drawing the ions in the plasma into the wafer W. The amount of ions in the plasma radiated onto the wafer W is proportional to an electron density of the plasma. The electron density of the plasma is proportional to a power of the high-frequency power HFS from the first high-frequency power supply HFS applied when the plasma is generated. In addition, the electron density of the plasma depends on a pressure in the processing container 12. The bias potential for drawing ions in the plasma into the wafer W is proportional to a power of the high-frequency power ITS from the second high-frequency power supply LFS applied when the bias potential is generated. The bias potential for drawing ions in the plasma into the water W depends on the pressure in the processing container 12. In addition, when the high-frequency power LFS is not applied to the stage 16, ions are drawn into the stage by a difference between a plasma potential which occurs when the plasma is generated and a potential of the stage 16.

In addition, heat input from the plasma includes, for example, heating by plasma emission, irradiation of the wafer W with electrons and radicals in the plasma, and a surface reaction on the wafer W by the ions and radicals. Such a component also depend on a power of an AC power and a pressure. The heat input from the plasma also depends on device parameters in relation to plasma generation, for example, a distance between the stage 16 and the upper electrode 30 and gas species supplied to the processing space S.

The heat transferred to the wafer W is transferred to the electrostatic chuck 18. Here, all the heat of the wafer W is not transferred to the electrostatic chuck 18, but the heat is transferred to the electrostatic chuck 18 depending on a degree of inhibiting heat transfer, such as a degree of contact between the wafer W and the electrostatic chuck 18. The degree of inhibiting heat transfer, that is, a thermal resistance is inversely proportional to a cross-sectional area with respect to a transfer direction of heat. For this reason, in FIG. 4, the degree of inhibiting heat transfer from the wafer W to the front surface of the electrostatic chuck 18 is represented as a thermal resistance per unit area $R_{th} \cdot A$ between the wafer W and the front surface of the electrostatic chuck 18. Here, reference symbol A is an area of the region in which the heater HT is provided. Reference symbol $R_{th}$ is a thermal resistance of the entire region in which the heater HT is provided. In FIG. 4, the amount of heat input from the wafer W to the front surface of the electrostatic chuck 18 is represented as a heat flux per unit area q from the water W to the front surface of the electrostatic chuck 18. In addition, the thermal resistance per unit area $R_{th} \cdot A$ between the wafer W and the front surface of the electrostatic chuck 18 depends on a surface condition of the electrostatic chuck 18, a value of the DC voltage applied from the DC power supply 22 in order to hold the water W, and a pressure of the heat transfer gas supplied to a space between the top surface of the electrostatic chuck 18 and the rear surface of the wafer W. Further, the thermal resistance $R_{th} \cdot A$ also depends on other device parameters in relation to thermal resistance or thermal conductivity.

The heat transferred to the front surface of the electrostatic chuck 18 raises the temperature of the electrostatic chuck 18, and is also transferred to the heater HT. In FIG. 4, an amount of heat input from the front surface of the electrostatic chuck 18 to the heater HT is represented as a heat flux per unit area $q_c$ from the front surface of the electrostatic chuck 18 to the heater HT.

In addition, the base 20 is cooled by the coolant flowing through the coolant flow path 24, and cools the electrostatic chuck 18 in contact with the base 20. In FIG. 4, an amount of heat dissipated from the rear surface of the electrostatic chuck 18 to the base 20 via the adhesive layer 19 is represented as a heat flux per unit area $q_{sus}$ from the rear surface of the electrostatic chuck 18 to the base 20. Thus, the heater HT is cooled by the heat dissipation, and the temperature of the heater HT is lowered.

Figure 5A:
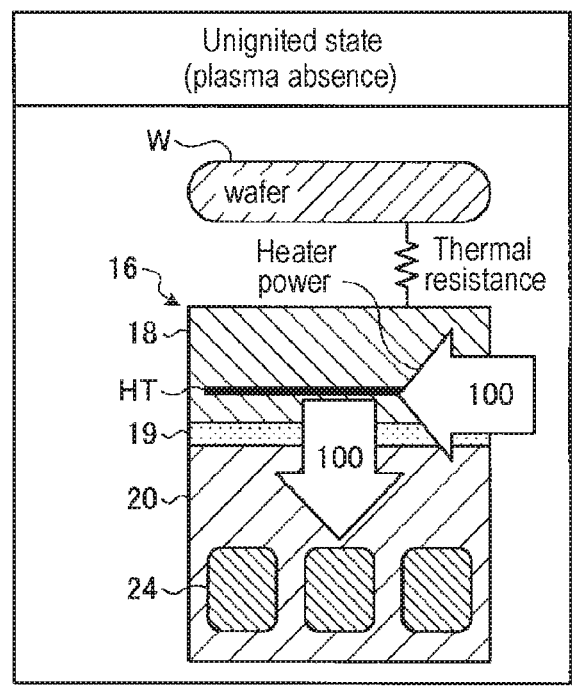
FIG. 5A is a view schematically illustrating an exemplary flow of energy in an unignited state.

In a case where the temperature of the heater HT is controlled to be constant, the heater HT is in a state in which a total sum of the amount of heat input to the heater HT and the amount of heat generated by the heater HT is equal to the amount of heat dissipated from the heater HT. For example, in an unignited state in which plasma is not ignited, the amount of heat generated by the heater HT is equal to the amount of heat dissipated from the heater HT. FIG. 5A is a view schematically illustrating an exemplary flow of energy in an unignited state. In the example of FIG. 5A, the heater HT dissipates a heat amount of "100" by being cooled by the base 20. For example, when the temperature of the heater HT is controlled to be constant, the heat amount of "100" is generated from the heater HT by the heater power $P_h$ supplied from the heater power supply HP.

Figure 5B:
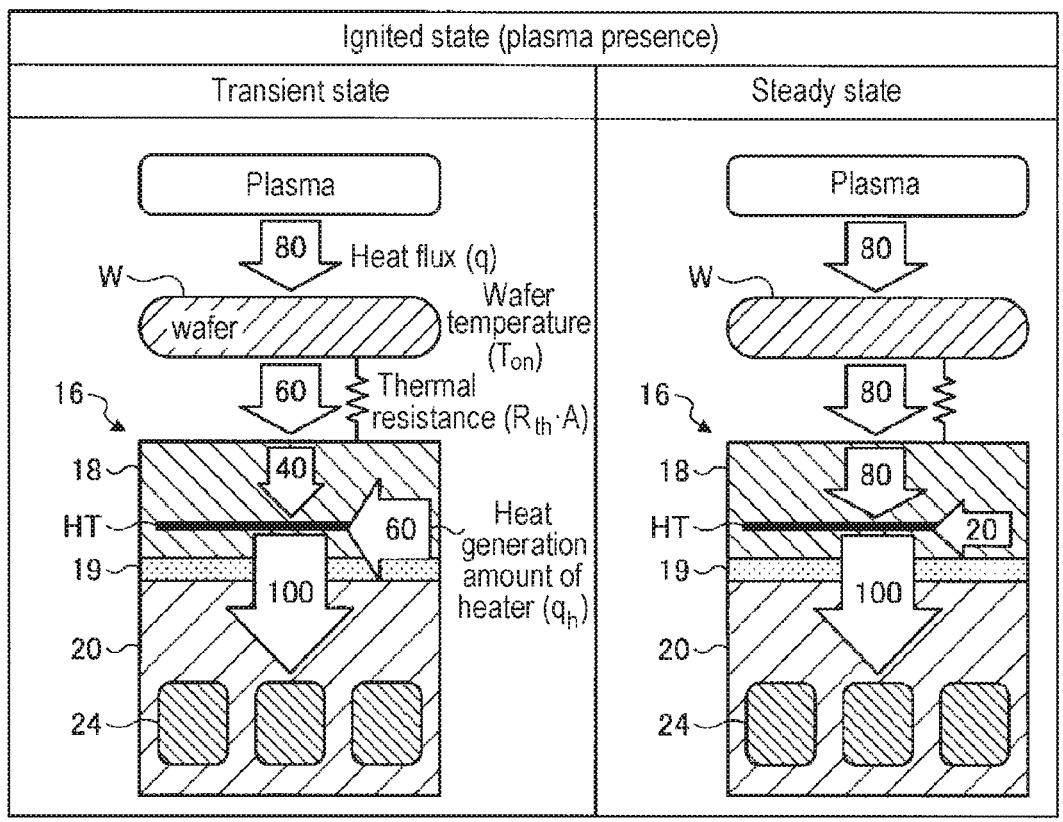
FIG. 5B is a view schematically illustrating exemplary flows of energy in an ignited state.

On the other hand, for example, in an ignited state in which plasma is ignited, the total sum of the amount of heat input to the heater HT and the amount of heat generated by the heater HT is equal to the amount of heat dissipated from the heater HT. FIG. 5B is a view schematically illustrating exemplary flows of energy in an ignited state. Here, the ignited state includes a transient state and a steady state. The transient state is a state in which, for example, the heat input amount is larger than the heat dissipation amount with respect to the wafer W or the electrostatic chuck 18 and thus the temperature of the wafer W or the electrostatic chuck 18 has an upward tendency over time. The steady state is a state in which the heat input amount and the heat dissipation amount of the wafer W or the electrostatic chuck 18 become equal to each other and thus the temperature of the wafer W or the electrostatic chuck 18 is kept substantially constant without having an upward tendency over time.

Even in the example of FIG. 5B, the heater HT dissipates a heat amount of "100" by being cooled by the base 20. In the ignited state, the temperature of the wafer W rises due to the heat input from the plasma until the wafer W reaches the steady state. In addition, heat is transferred from the wafer W to the heater HT via the electrostatic chuck 18. As described above, when the temperature of the heater HT is controlled to be constant, the amount of heat input to the heater HT is equal to the amount of heat dissipated from the heater HT. In the heater HT, the heat amount required to keep the temperature of the heater HT constant decreases. For this reason, the power supplied to the heater HT is reduced.

For example, in FIG. 5B, in the example of the "Transient state", a heat amount of "80" is transferred from the plasma to the wafer W. The heat transferred to the wafer W is transferred to the electrostatic chuck 18. In addition, when the temperature of the wafer W is not in the steady state, some of the heat transferred to the wafer W acts on the temperature rising of the wafer W. The heat amount acting on the temperature rising of the wafer W depends on a heat capacity of the wafer W. Thus, among the heat amount of "80" transferred from the plasma to the wafer W, a heat amount of "60" is transferred from the wafer W to the front surface of the electrostatic chuck 18. The heat transferred to the front surface of the electrostatic chuck 18 is transferred to the heater HT. In addition, when the temperature of the electrostatic chuck 18 is not in the steady state, some of the heat transferred to the front surface of the electrostatic chuck 18 acts on the temperature rising of the electrostatic chuck 18. The heat amount acting on the temperature rising of the electrostatic chuck 18 depends on a heat capacity of the electrostatic chuck 18. Thus, among the heat amount of "60" transferred to the front surface of the electrostatic chuck 18, a heat amount of "40" is transferred to the heater HT. Therefore, when the temperature of the heater HT is controlled to be constant, a heat amount of "60" is generated from the heater HT by the heater power $P_h$ supplied from the heater power supply HP.

In addition, in FIG. 5B, in the example of the "Steady state", a heat amount of "80" is transferred from the plasma to the wafer W. The heat transferred to the wafer W is transferred to the electrostatic chuck 18. In addition, when the temperature of the wafer W is in the steady state, the wafer is in the state in which the heat input amount and the heat dissipation amount are equal to each other. Thus, the heat amount of "80" transferred from the plasma to the water W is transferred from the wafer W to the front surface of the electrostatic chuck 18. The heat transferred to the front surface of the electrostatic chuck 18 is transferred to the heater HT. When the temperature of the heater HT is in the steady state, the electrostatic chuck 18 is in the state in which the heat input amount and heat dissipation amount are equal to each other. Thus, the heat amount of "80" transferred to the front surface of the electrostatic chuck 18 is transferred to the heater HT. Therefore, when the temperature of the heater HT is controlled to be constant, a heat amount of "20" is generated from the heater HT by the heater power $P_h$ supplied from the heater power supply HP.

As illustrated in FIGS. 5A and 5B, the power supplied to the heater HT is lower in the ignited state than in the unignited state. In the ignited state, the power supplied to the heater HT decreases until the supplied power caches the steady state.

In addition, as shown in FIGS. 5A and 5B, when the temperature of the heater HT is controlled to be constant, even in any of the "Unignited state," the "Transient state," and the "Steady state," the heater HT dissipates the heat amount of "100" by being cooled by the base 20. That is, the heat flux $q_{sus}$ per unit area toward the coolant supplied from the heater HT to the coolant flow path 24 formed inside the base 20 is kept constant at all times, and a temperature gradient from the heater HI to the coolant is also kept constant at all times. Therefore, the temperature sensor used to control the temperature of the heater HT to be kept constant needs not to be directly attached to the heater HT. For example, at a location between the heater HT and the coolant, such as on the rear surface of the electrostatic chuck 18, inside the adhesive layer 19, inside the base 20, and the like, a temperature difference between the heater HT and the temperature sensor is kept constant at all times. Thus, it is possible to output, as the temperature of the heater HT, a value obtained by calculating the temperature difference ΔT between the temperature sensor and the heater HT by using a thermal conductivity, a thermal resistance, and the like of material between the heater HT and the temperature sensor, and by adding the temperature ΔT to a temperature value detected by the temperature sensor. Therefore, it is possible to control the actual temperature of the heater HT to be constant.

Figure 6A:
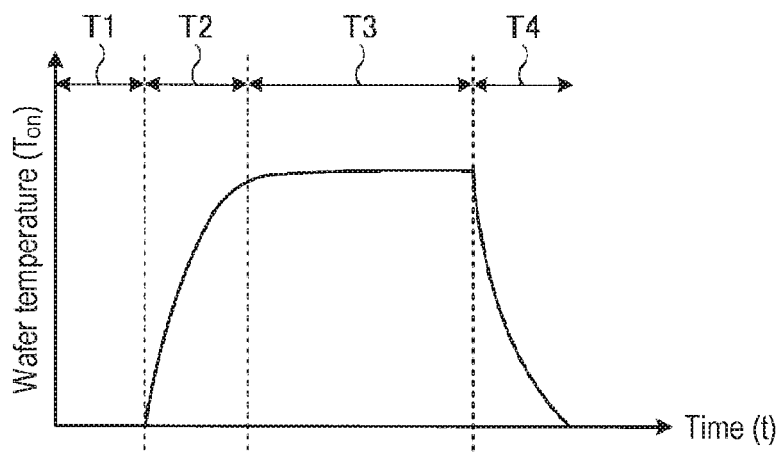
FIGS. 6A and 6B are views representing exemplary changes in a temperature of a wafer W and a power supplied to a heater HT, respectively.
Figure 6B:
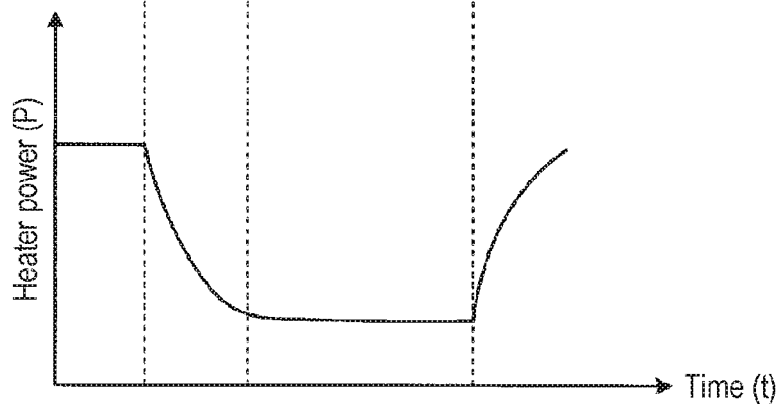

FIGS. 6A and 6B are views representing exemplary changes in the temperature of the wafer W and the power supplied to the heater HT, respectively. FIG. 6A represents a change in the temperature of the wafer W. FIG. 6B represents a change in the power supplied to the heater HT. FIGS. 6A and 6B illustrate exemplary results obtained by controlling the temperature of the heater HT to be constant, igniting plasma from the unignited state in which plasma is not ignited, and measuring the temperature of the wafer W and the power supplied to the heater HT. The temperature of the wafer W was measured using a water for temperature measurement, such as Etch Temp sold by KLA-Tencor Corporation.

Period T1 in FIGS. 6A and 6B corresponds to the unignited state in which plasma is not ignited. In period T1, the power supplied to the heater HT is kept constant. Period T2 in FIGS. 6A and 6B corresponds to the ignited state in which plasma is ignited and corresponds to the transient state. In period T2, the power supplied to the heater HT decreases. In addition, in period T2, the temperature of the wafer W rises to a set temperature. Period T3 in FIGS. 6A and 6B corresponds to the ignited state in which the plasma is ignited. In period T3, the temperature of the wafer W is kept constant and is in the steady state. When the electrostatic chuck 18 is also brought into the steady state, the power supplied to the heater HT becomes substantially constant, and fluctuation of downward tendency is stabilized. Period T4 in FIGS. 6A and 6B corresponds to the unignited state in which plasma is extinguished. In period T4, since heat input from the plasma to the wafer W disappears, the temperature of the wafer W decreases and the power supplied to the heater HT increases.

The downward tendency of the power supplied to the heater HI in the transient state illustrated in period T2 in FIGS. 6A and 6B is changed depending on, for example, the amount of heat input from the plasma to the wafer W and the thermal resistance between the wafer W and the front surface of the electrostatic chuck 18.

Figure 7:
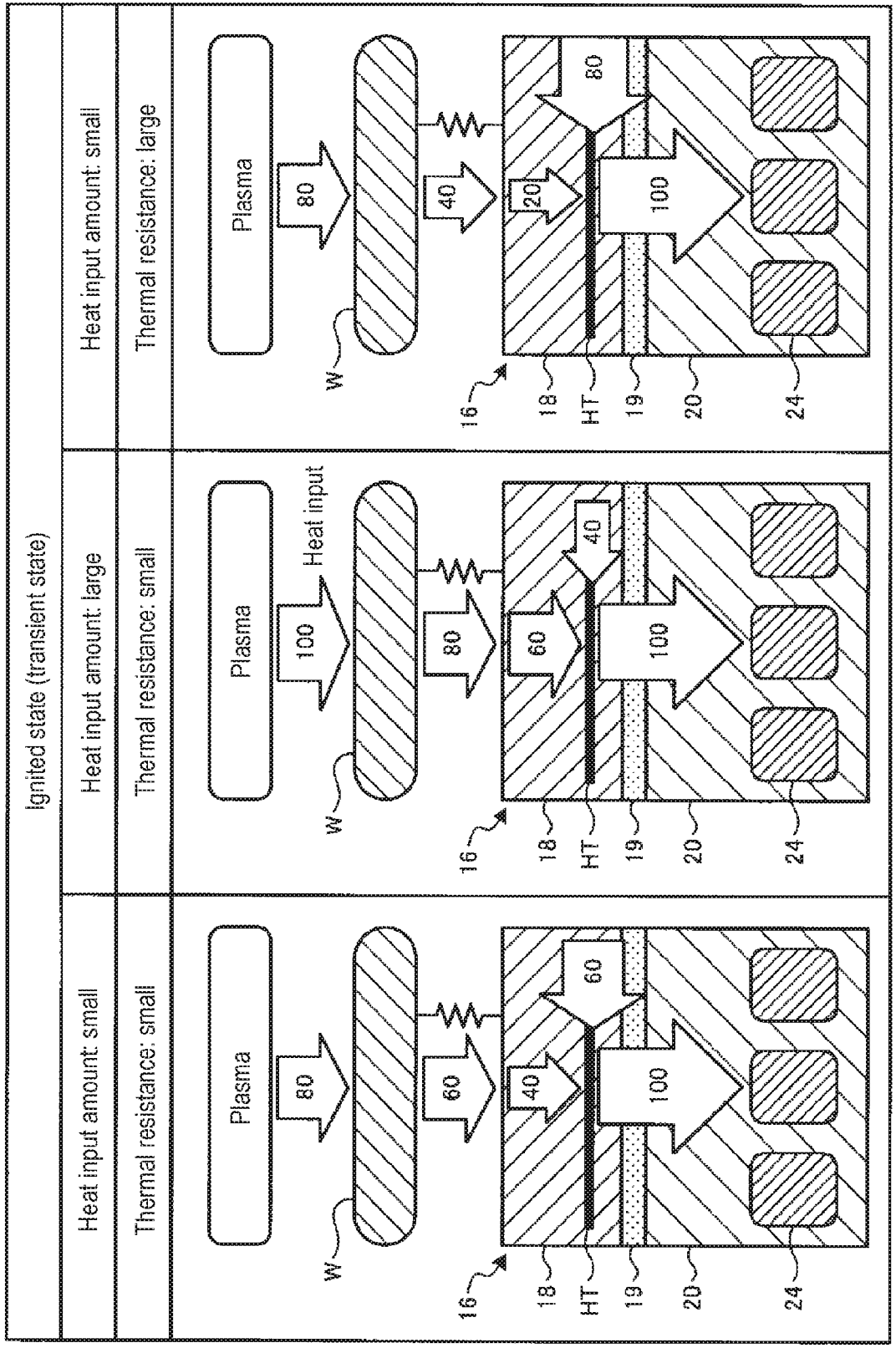
FIG. 7 is a view schematically illustrating exemplary flows of energy in an ignited state.

FIG. 7 is a view schematically illustrating flows of energy in an ignited state. In addition, all the examples of FIG. 7 correspond to a transient state. For example, in FIG. 7, in an example of "Heat input amount: small" and "Thermal resistance: small," a heat amount of "80" is transferred from the plasma to the wafer W. Among the heat amount of "80" transferred from the plasma to the wafer W, a heat amount of "60" is transferred from the water W to the front surface of the electrostatic chuck 18. In addition, among the heat amount of "60" transferred to the front surface of the electrostatic chuck 18, a heat amount of "40" is transferred to the heater HT. For example, when the temperature of the heater HT is controlled to be constant, a heat amount of "60" is generated from the heater HT by the heater power $P_h$ supplied from the heater power supply HP.

For example, in FIG. 7, in an example of "Heat input amount: small" and "Thermal resistance: large," a heat amount of "100" is transferred from the plasma to the water W. Among the heat amount of "100" transferred from the plasma to the wafer W, a heat amount of "80" is transferred from the wafer W to the front surface of the electrostatic chuck 18. In addition, among the heat amount of "80" transferred to the front surface of the electrostatic chuck 18, a heat amount of "60" is transferred to the heater HT. For example, when the temperature of the heater HT is controlled to be constant, a heat amount of "40" is generated from the heater HT by the heater power $P_h$ supplied from the heater power supply HP.

For example, in FIG. 7, in an example of "Heat input amount: small" and "Thermal resistance: large," a heat amount of "80" is transferred from the plasma to the wafer W. Among the heat amount of "80" transferred from the plasma to the wafer W, a heat amount of "40" is transferred from the wafer W to the front surface of the electrostatic chuck 18. Among the heat amount of "40" transferred to the front surface of the electrostatic chuck 18, a heat amount of "20" is transferred to the heater HT. For example, when the temperature of the heater HT is controlled to be constant, a heat amount of "80" is generated from the heater HT by the heater power $P_h$ supplied from the heater power supply HP.

As described above, when the temperature of the heater HT is controlled to be constant, the heater power $P_h$ varies depending on the amount of heat input from the plasma to the wafer W and the thermal resistance between the wafer W and the front surface of the electrostatic chuck 18. Accordingly, the downward tendency of the power supplied to the heater HT in period T2 illustrated in FIG. 6B varies depending on, for example, the amount of heat input from the plasma to the wafer W and the thermal resistance between the wafer W and the front surface of the electrostatic chuck 18. Thus, the graph of the power supplied to the heater HT in period T2 may be modeled by using the amount of heat input from the plasma to the wafer W and the thermal resistance between the wafer W and the front surface of the electrostatic chuck 18 as parameters. That is, variation of the power supplied to the heater FIT in period T2 may be modeled by an arithmetic equation by using the amount of heat input from the plasma to the wafer W and the thermal resistance between the wafer W and the front surface of the electrostatic chuck 18 as parameters.

In the present embodiment, the variation in the power supplied to the heater HT in period T2 illustrated in FIG. 6B is modeled as an equation per unit area. For example, it is assumed that a time elapsed from ignition of plasma is t, that the heater power $P_h$ at the elapsed time is $P_{h(t)}$, and that the heat generation amount $q_h$ per unit area from the heater HT when a heat flux from the plasma exists at the elapsed time t is $q_{h(t)}$. In this case, the heat generation amount $q_{h(t)}$ per unit area from the heater HT when the heat flux from the plasma exists at the elapsed time t may be expressed by the following Equation (2). In addition, a heat generation amount $q_{h\_off}$ per unit area from the heater HT in a steady state where the plasma is not ignited and there is no heat flux from the plasma may be expressed by the following Equation (3). The thermal resistance per unit area $R_{thc} \cdot A$ between the front surface of the electrostatic chuck 18 and the heater may be expressed by the following Equation (4). The heat flux $q_p$ varies depending on whether plasma is generated or not. It is assumed that the heat flux $q_p$ per unit area from the plasma to the wafer W when the plasma is generated is a heat flux $q_{p\_on}$. When $a_1$, $a_2$, $a_3$, $\lambda_1$, $\lambda_2$, $\tau_1$, and $\tau_2$ are expressed in the following Equations (5) to (11) by using the heat flux per unit area $q_{p\_on}$ from the plasma to the wafer W and the thermal resistance per unit area $R_{th} \cdot A$ between the wafer W and the front surface of the electrostatic chuck 18 as parameters, the heat generation amount per unit area $q_{h(t)}$ from the heater HT when the heat flux from the plasma exists is given by the following Equation (1).

$$q_{h(t)} = q_{h\_off} - q_{P\_on} - \frac{R_{th} \cdot A \cdot q_{P\_on}}{R_{th} \cdot A \cdot (\lambda_1 - \lambda_2)} \left\{ \left(1 + \frac{a_2 + a_3}{a_1 \cdot a_3} \cdot \lambda_2\right)(2a_1 + 3\lambda_1)\exp\left(-\frac{t}{\tau_1}\right) - \left(1 + \frac{a_2 + a_3}{a_1 \cdot a_3} \cdot \lambda_1\right)(2a_1 + 3\lambda_2)\exp\left(-\frac{t}{\tau_2}\right) \right\} \quad (1)$$

$$q_{h(t)} = P_{h(t)}/A \quad (2)$$

$$q_{h\_off} = P_{h-off}/A \quad (3)$$

$$R_{th} \cdot A = \frac{Z_c}{K_c} \quad (4)$$

$$a_1 = \frac{1}{\rho_w \cdot C_w \cdot z_w \cdot R_{th} \cdot A} \quad (5)$$

$$a_2 = \frac{2}{\rho_c \cdot C_c \cdot z_c \cdot R_{th} \cdot A} \quad (6)$$

-continued $$a_3 = \frac{2}{\rho_c \cdot C_c \cdot z_c \cdot R_{thc} \cdot A} \quad (7)$$

$$\lambda_1 = \frac{1}{2}\left\{-(a_1 + 2a_2 + 2a_3) + \sqrt{(a_1 + 2a_2 + 2a_3)^2 - 8a_1 \cdot a_3}\right\} \quad (8)$$

$$\lambda_2 = \frac{1}{2}\left\{-(a_1 + 2a_2 + 2a_3) - \sqrt{(a_1 + 2a_2 + 2a_3)^2 - 8a_1 \cdot a_3}\right\} \quad (9)$$

$$\tau_1 = -\frac{1}{\lambda_1} \quad (10)$$

$$\tau_2 = -\frac{1}{\lambda_2} \quad (11)$$

Here, $P_{h(t)}$ is a heater power [W] when a heat flux from the plasma exists at the elapsed time t.

$P_{h\_Off}$ is a heater power [W/m²] in the steady state where there is no heat flux from the plasma.

$q_{h(t)}$ is a heat generation amount per unit area [W/m²] from the heater HT when there is a heat flux from the plasma at the elapsed time t.

$q_{h\_Off}$ is a heat generation amount per unit area [W/m²] from the heater HT in the steady state where there is no heat flux from the plasma.

$R_{th} \cdot A$ is a heat flux per unit area [W/m²] from the plasma to the wafer W.

$R_{thc} \cdot A$ is a thermal resistance per unit area [K·m²/W] between the front surface of the electrostatic chuck 18 and the heater.

A is an area [m²] of a region in which the heater is provided.

$\rho_w$ is a density of the wafer W [kg/m³].

$C_w$ is a heat capacity per unit area [J/K·m²] of the wafer W.

$z_w$ is a thickness [m] of the wafer W.

$\rho_c$ is a density [kg/m³] of ceramic forming the electrostatic chuck 18.

$C_c$ is a heat capacity per unit area [J/K·m²] of the ceramic forming the electrostatic chuck 18.

$z_c$ is a distance [m] from the front surface of the electrostatic chuck 18 to the heater HT.

$K_c$ is a thermal conductivity [W/K·m] of the ceramic forming the electrostatic chuck 18.

t is a time [sec] elapsed after the plasma is ignited.

With respect to $a_1$ represented in Equation (5), $1/a_1$ is a time constant indicating a degree of difficulty in heating the wafer W. With respect to $a_2$ represented in Equation (6), $1/a_2$ is a time constant indicating a degree of difficulty in heat input to the electrostatic chuck 18, that is, a degree of difficulty in heating the electrostatic chuck 18. With respect to $a_3$ represented in Equation (7), $1/a_3$ is a time constant indicating a degree of difficulty in heat infiltration to the electrostatic chuck 18, that is, a degree of difficulty in heating the electrostatic chuck 18.

Each of the area A of the heater HT, the density $\rho_w$ of the wafer W, the heat capacity per unit area $C_w$ of the wafer W, the thickness $z_w$ of the wafer W, the density $\rho_c$ of the ceramic forming the electrostatic chuck 18, the heat capacity per unit area $C_c$ of the ceramic forming the electrostatic chuck 18, the distance $z_c$ from the front surface of the electrostatic chuck 18 to the heater HT, and the thermal conductivity $K_c$ of the ceramic forming the electrostatic chuck 18 is predetermined based on the actual configuration of the wafer W or the plasma processing apparatus 10. $R_{thc} \cdot A$ is predetermined by Equation (4) from the thermal conductivity $K_c$ and the distance $z_c$.

The heater power $P_{h(t)}$ when the heat flux from the plasma exists at the time t elapsed after the ignition of the plasma and the heater power $P_{h\_Off}$ in the steady state where there is no heat flux from the plasma may be determined by measurement using the plasma processing apparatus 10. In addition, as represented in Equations (2) and (3), by dividing the calculated heater power $P_{h(t)}$ and heater power $P_{h\_Off}$ by the area A of the heater HT, respectively, it is possible to calculate the heat generation amount per unit area $q_{h(t)}$ from the heater HT when the heat flux from plasma exists and the heat generation amount $q_{h\_Off}$ per unit area from the heater HT in the steady state where there is no heat flux from the plasma.

In addition, it is possible to calculate the heat flux $q_{p\_on}$ per unit area from the plasma to the wafer W and the thermal resistance $R_{th} \cdot A$ per unit area between the wafer W and the front surface of the electrostatic chuck 18 by performing fitting of Equation (1) by using measurement results.

In addition, the graph of the temperature of the wafer W in period T2 illustrated in FIG. 6A may also be modeled by using the amount of heat input from the plasma to the wafer W and the thermal resistance between the wafer W and the front surface of the electrostatic chuck 18 as parameters. In the present embodiment, variation in the temperature of the wafer W in period T2 is modeled as an equation per unit area. For example, when $a_1$, $a_2$, $a_3$, $\lambda_1$, $\lambda_2$, $\tau_1$, and $\tau_2$ which are expressed in Equations (5) to (11) by using the heat flux per unit area $q_{p\_on}$ from the plasma to the wafer W and the thermal resistance per unit area $R_{th} \cdot A$ between the wafer W and the front surface of the electrostatic chuck 18 as parameters, a temperature $T_{w(t)}$ [degrees C.] of the wafer W at the elapsed time t may be expressed as in the following Equation (12).

$$T_{w(t)} = T_h + q_{p\_on} \cdot (R_{th} \cdot A + R_{the} \cdot A) + \frac{q_{p\_on}}{\rho_w \cdot C_w \cdot z_w \cdot (\lambda_1 - \lambda_2)} \quad (12)$$

$$\left\{\left(1 + \frac{a_2 + a_3}{a_1 \cdot a_3} \cdot \lambda_2\right)\exp\left(-\frac{t}{\tau_1}\right) - \left(1 + \frac{a_2 + a_3}{a_1 \cdot a_3} \cdot \lambda_1\right)\exp\left(-\frac{t}{\tau_2}\right)\right\}$$

Here, $T_{w(t)}$ is the temperature [degrees C.] of the wafer W at the elapsed time t.

$T_h$ is a temperature [degrees C.] of the heater HT controlled to be constant.

The temperature $T_h$ of the heater HT may be calculated from a condition when actually controlling the temperature of the wafer W to be constant.

When the heat flux $q_{p\_on}$ and the thermal resistance $R_{th} \cdot A$ are calculated by performing the fitting of Equation (1) by using the measurement results, the temperature Tw of the wafer W/may be calculated from Equation (12).

When the elapsed time t is sufficiently longer than the time constants $\tau_1$ and $\tau_2$ represented by Equations (10) and (11), respectively, that is, when the temperature $T_h$ of the heater HT at which the temperature Tw of the wafer W becomes a target temperature after transition from the transient state in period T2 of FIGS. 6A and 6B to the steady state in period T3, Equation (12) may be omitted as in the following Equation (13).

$$T_{w(t)} = T_h + q_{p\_on} \cdot (R_{th} \cdot A + R_{the} \cdot A) \quad (13)$$

For example, the temperature Tw of the wafer W may be calculated based on the temperature $T_h$ of the heater, the heat flux $q_{p\_on}$, and the thermal resistances $R_{th} \cdot A$ and $R_{thc} \cdot A$ by using Equation (13).

By the way, in order to determine situation of the plasma processing, it is necessary to detect a state of the plasma during the plasma processing in the plasma processing apparatus 10. For example, the plasma processing apparatus 10 is required to detect density distribution of the plasma as the state of the plasma. In the plasma processing apparatus 10, the amount of heat input from the plasma changes depending on the density distribution of the plasma.

Figure 8:
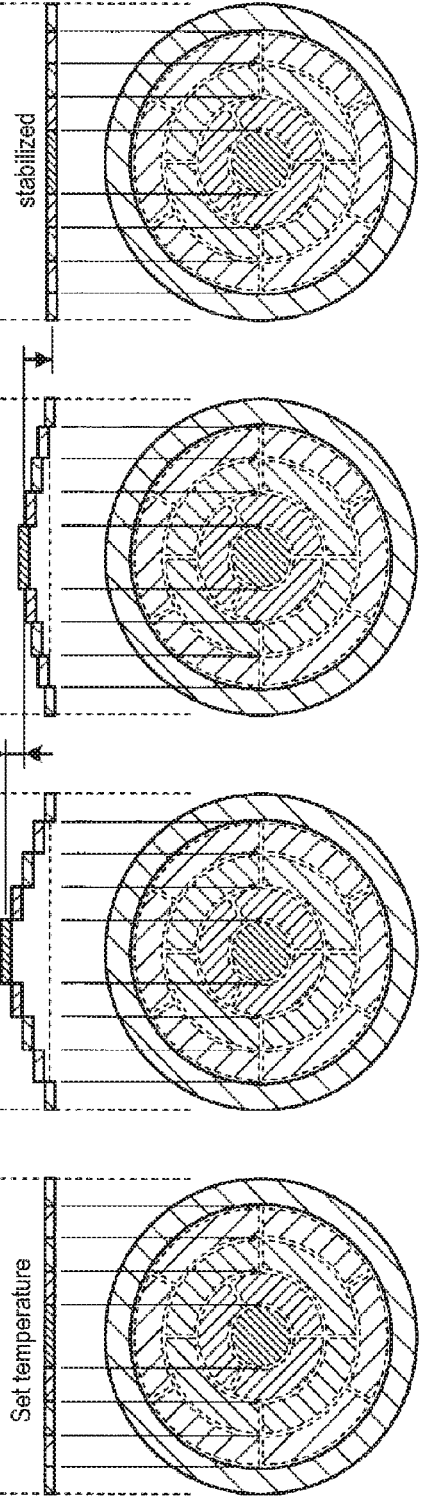
FIGS. 8A to 8D are views schematically illustrating exemplary temperature changes in apt unignited state and a transient state depending on a plasma density distribution.

FIGS. 8A to 8D are views schematically illustrating exemplary changes in temperature in apt unignited state and a transient state depending on plasma density distribution. In FIGS. 8A to 8D, the plasma density distribution during the plasma processing and the surface temperature change of each division region of the stage 16 are shown in time series. FIG. 8A shows an unignited state. In the unignited state, when plasma is not generated and the power supplied to each heater HT is controlled such that the temperature of each heater HT is constant, the temperature of each division region of the mounting region 18a is also constant. FIGS. 8B to 8D show a transient state. In a region in which plasma density is high, the amount of heat input from the plasma to the mounting region 18a is large. In a region in which the plasma density is low, the amount of heat input from the plasma to the mounting region 18a is small. For example, when the density distribution of the generated plasma is high in the center of the mounting region 18a and low in the periphery of the mounting region 18a as shown in FIGS. 8B to 8D, the heat input amount is high in the center of the mounting region 18a. Therefore, the surface temperature in the center of the mounting region 18a rises to be higher than that in the vicinity of the periphery. When the power supplied to each heater HT is controlled such that the temperature of each heater HI is constant, the amount of increase in the surface temperature of the mounting region 18a is reduced, and thus the power supplied to the heater HT is reduced. Since the heater HT in the center of the mounting region 18a has a large amount of heat input, the power supplied thereto is much lower than that supplied to the heater HT in the vicinity of the periphery.

Figure 9:
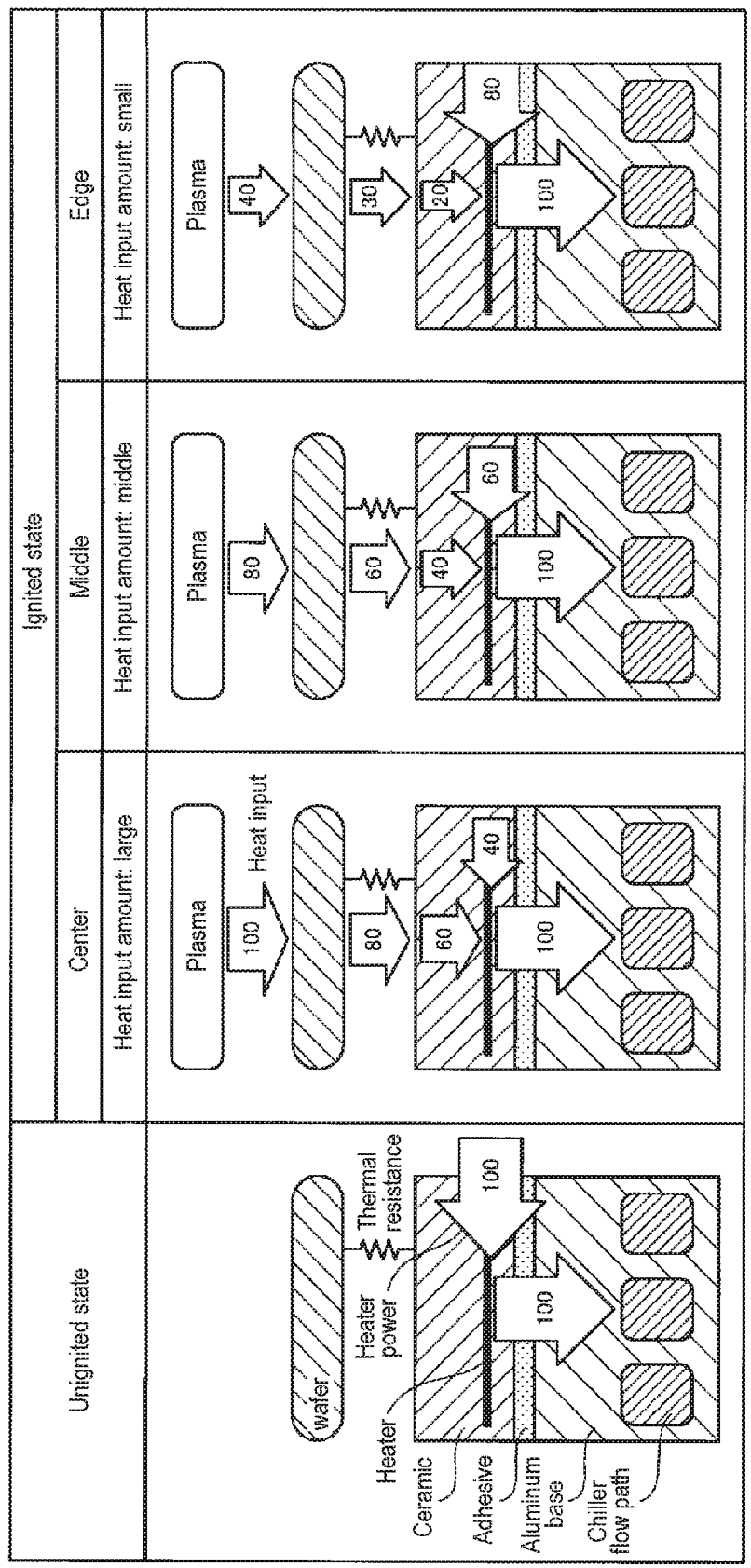
FIG. 9 is a view schematically illustrating exemplary flows of energy in an unignited state and a transient state.

FIG. 9 is a view schematically illustrating exemplary flows of energy in an unignited state and a transient state. In the example of FIG. 9, the mounting region 18a is divided into three zones of a central portion ("Center") in the vicinity of the center of the mounting region 18a, a peripheral portion ("Middle") surrounding the central portion, and an edge portion ("Edge") of the mounting region 18a surrounding the peripheral portion. It is assumed that the plasma density distribution is high in the center of the mounting region 18a and low in the periphery of the mounting region 18a, as in FIGS. 8B to 8D.

In the unignited state illustrated in FIG. 9, the heater HT dissipates a heat amount of "100" by being cooled from the base 20. For example, when the temperature of the heater HT is controlled to be constant, a heat amount of "100" is generated from the heater HT by the heater power $P_h$ supplied from the heater power supply HP. Thus, the amount of heat generated from the heater HT and the amount of heat dissipated from the heater HT become equal to each other.

In addition, in the transient state illustrated in FIG. 9, since the plasma density distribution in the center of the mounting region 18a is higher than that in the periphery of the mounting region 18a, the heat input amount in the central portion ("Center") of the mounting region 18a is "large," and the heat input amount in the peripheral portion ("Middle") of the mounting region 18a is "middle," and the heat input amount of the edge portion ("Edge") of the mounting region 18a is "small," For example, when the thermal resistances of the central portion, the peripheral portion, and the edge portion are the same, in the central portion ("Center"), a heat amount of "100" is input from the plasma, and a heat amount of "60" is transferred to the heater HT. In the peripheral portion ("Middle"), a heat amount of "80" is input from the plasma, and a heat amount of "40" is transferred to the heater HT. In the edge portion, a heat amount of "40" is input from the plasma, and a heat amount of "20" is transferred to the heater HT.

Figure 10A:
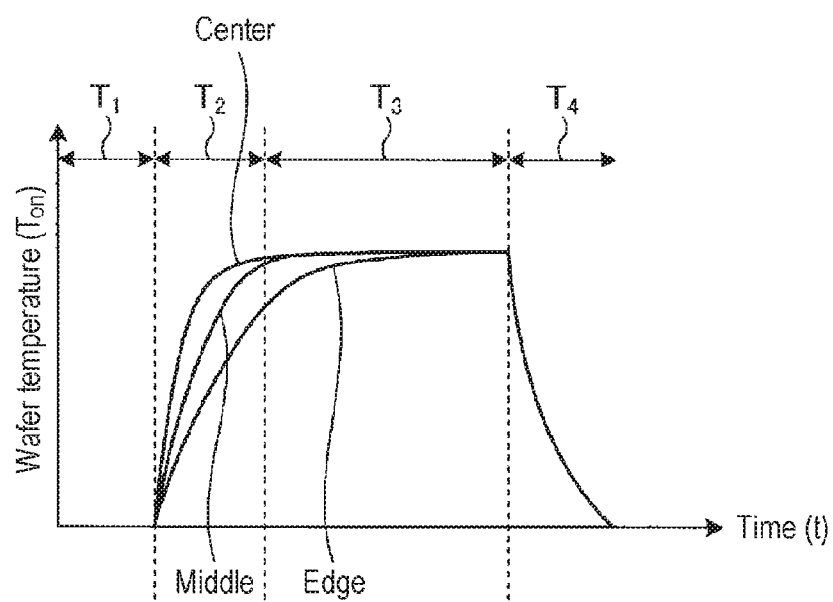
FIGS. 10A and 10B are views representing exemplary changes in a temperature of a wafer W and a power supplied to a heater I-IT, respectively.
Figure 10B:
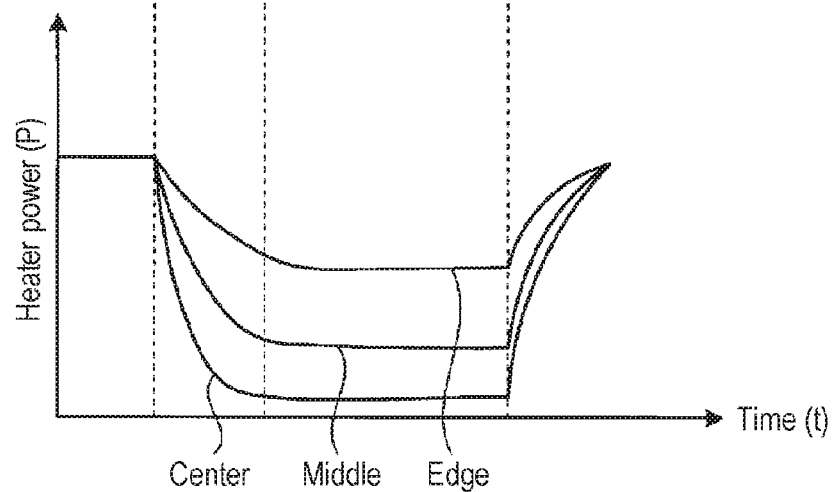

FIGS. 10A and 10B are views representing exemplary changes in the temperature of the wafer W and the power supplied to the heater HT, respectively. FIG. 10A represents changes in the temperature of the wafer W in the central portion ("Center"), the peripheral portion ("Middle"), and the edge portion ("Edge"). FIG. 10B represents changes in the power supplied to the heater HT in the central portion ("Center"), the peripheral portion ("Middle"), and the edge portion ("Edge"). As represented in FIG. 10B, waveforms of the supplied power also change depending on the heat input amount. Accordingly, the amount of heat input to each zone may be calculated by measuring the power supplied to the heater HT in each zone in the unignited state and in the transient state, and performing the fitting of Equation (1) by using the measurement results for each zone. In addition, the plasma density distribution may be obtained from the heat input amount of each zone. That is, the plasma processing apparatus 10 according to an embodiment is able to detect the state of plasma without disposing a sensor in the processing container 12.

Return to FIG. 3. The heater controller 102a controls the temperature of each heater HT. For example, the heater controller 102a controls the temperature of each heater HT by outputting, to the heater power supply HP, control data indicating a power supplied to each heater HT and controlling the power supplied from the heater power supply HP to each heater HT.

During the plasma processing, a target set temperature of each heater HT is set in the heater controller 102a. For example, in the heater controller 102a, a target temperature in each of the division regions of the mounting region 18a of a target wafer W is set as a set temperature of the heater HT of a corresponding division region. The target temperature is, for example, a temperature at which accuracy of a plasma etching process on the wafer W becomes the best.

During the plasma processing, the heater controller 102a controls the power supplied to each heater HT such that each heater HT has the set temperature. For example, the heater controller 102a compares, for each division region, a temperature of each division region of the mounting region 18a indicated by the temperature data input to the external interface 101 with the set temperature of a corresponding division region. In addition, the heater controller 102a specifies division regions having a temperature lower than the set temperature and division regions having a temperature higher than the set temperature. The heater controller 102a outputs control data to the heater power supply HP so as to increase the power supplied to the division regions having a temperature lower than the set temperature and to decrease the power supplied to the division regions having a temperature higher than the set temperature.

The measurement part 102b measures the power supplied to each heater HT by using the power supplied to each heater HT indicated by the power data input to the external interface 101. For example, the measurement part 102b measures the power supplied to each heater HT in the unignited state in which plasma is not ignited, by controlling the power supplied to each heater HT by the heater controller 102a such that the temperature of each heater HT becomes constant. In addition, the measurement part 102b measures the power supplied to each heater HT in the transient state until variation in the downward tendency of the power supplied to each heater HT after igniting the plasma is stabilized.

For example, the measurement part 102b measures the power suppled to each heater HT in the unignited state before the start of the plasma processing in a state in which the heater controller 102a controls the power supplied to each heater HT such that the temperature of each heater HT becomes a constant set temperature. In addition, the measurement part 102b measures the power supplied to each heater HT in the transient state until variation in the downward tendency of the power supplied to each heater HT after igniting the plasma is stabilized. The power supplied to each heater HT in the unignited state may be measured at least once in each heater HT, or may be measured multiple times to use an average value as the power to be supplied in the unignited state. The power supplied to each heater HT in the transient state may be measured twice or more. The measurement timing for measuring the supplied power may be preferably a timing having a large downward tendency of the supplied power. In addition, when the number of measurement times is small, the measurement timings may be separated from one another by a predetermined period or more. In the present embodiment, the measurement part 102b measures the power supplied to each heater HT at a predetermined cycle (e.g., 0.1 second cycle) during the plasma processing period. Thus, power supplied to each heater HI in the transient state is measured multiple times.

The measurement part 102b measures the power supplied to each heater HT in the unignited state and the transient state at a predetermined cycle. For example, the measurement part 102b measures the power supplied to each heater HT in the unignited state and the transient state in each time when e wafer W is exchanged and the exchanged wafer W is placed on the stage 16 so as to perform the plasma processing. In addition, for example, the parameter calculator 102c may measure the power supplied to each heater HT in the unignited state and the transient state in each plasma processing.

The parameter calculator 102c calculates, for each heater HT, a heat input amount and a thermal resistance by using an amount of heat input from the plasma and a thermal resistance between the wafer W and each heater HT as parameters and by using a calculation model for calculating the supplied power in the transient state. For example, the parameter calculator 102c performs fitting on the calculation model by using the power supplied in the unignited state and the transient state and measured by the measurement part 102b, and calculates the heat input amount and the thermal resistance.

For example, the parameter calculator 102c calculates the heater power $P_{h\_Off}$ in the unignited state for each elapsed time t for each heater HT. Further, the parameter calculator 102c calculates the heater power $P_{h(t)}$ in the transient state for each elapsed time t for each heater HT. Then, the parameter calculator 102c divides each of the calculated heater power $P_{h(t)}$ and the heater power $P_{h\_Off}$ by the area of each heater HT, thereby obtaining the heat generation amount $q_{h\_Off}$ per unit area from the heater HT in the unignited state for each elapsed time t and the heat generation amount per unit area $q_{h(t)}$ from the heater HT in the transient state for each elapsed time t.

The parameter calculator 102c calculates the heat flux $q_{p\_on}$ and the thermal resistance $R_{th} \cdot A$, which minimize an error, by performing, for each heater HT, fitting of the heat generation amount per unit area $q_{h(t)}$ from the heater HT for each elapsed time t and the heat generation amount per unit area $q_{h\_Off}$ from the heater HT by using Equations (1) to (11) described above as a calculation models.

The parameter calculator 102c calculates the heat flux $q_{p\_on}$ and the thermal resistance $R_{th} \cdot A$ in a predetermined cycle by using the power supplied and measured in the unignited state and the transient state. For example, each time when the wafer W is exchanged, the parameter calculator 102c calculates the heat flux $q_{p\_on}$ and the thermal resistance $R_{th} \cdot A$ by using the power supplied and measured in the unignited state and the transient state in a state in which the wafer W is placed on the stage 16. For example, the parameter calculator 102c may calculate, for each plasma processing, the heat flux $q_{p\_on}$ and the thermal resistance $R_{th} \cdot A$ by using the power supplied in the unignited state and the transient state.

The output part 102d controls the output of various kinds of information. For example, the output part 102d outputs information based on the heat flux $q_{p\_on}$ calculated by the parameter calculator 102c in a predetermined cycle. For example, the output part 102d outputs information indicating the plasma density distribution to the user interface 103 based on the heat flux $q_{p\_on}$ for each heater HT calculated by the parameter calculator 102c. For example, each time the wafer W is exchanged, the output part 102d outputs, to the user interface 103, information indicating the plasma density distribution when the plasma processing is performed on the water W. In addition, the output part 102d may output, as data, the information indicating the plasma density distribution to an external device.

Figure 11A:
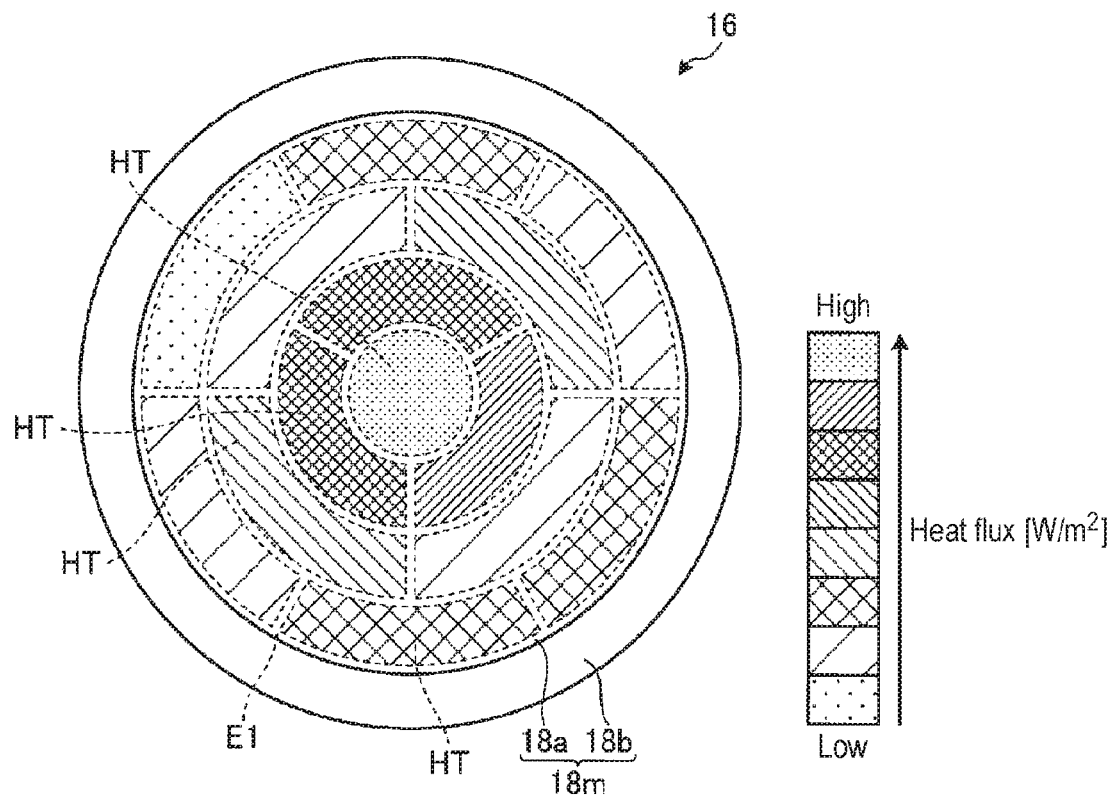
FIG. 11A is a view illustrating an exemplary output of information indicating a plasma density distribution.

FIG. 11A is a view illustrating an exemplary output of information indicating plasma density distribution. In the example of FIG. 11A, the heat flux $q_{p\_on}$ of each division region of the mounting region 18a provided with the heater HT is represented in a pattern.

Figure 11B:
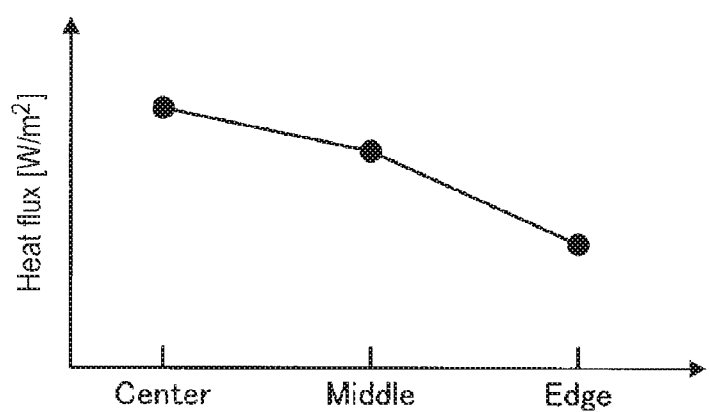
FIG. 11B is a view illustrating an exemplary output of information indicating a plasma density distribution.

FIG. 11B is a view illustrating an exemplary output of information indicating plasma density distribution. In the example of FIG. 11B, the heat flux $q_{p\_on}$ in each of the central portion ("Center"), the peripheral portion ("Middle"), and the edge portion ("Edge") is shown.

Due to the output of the information described above, a process manager or a manager of the plasma processing apparatus 10 can recognize the state of the plasma.

However, in the plasma processing apparatus 10, an abnormality may occur in the state of plasma. For example, in the plasma processing apparatus 10, the characteristics in the processing container 12 may change due to, for example, considerable consumption of the electrostatic chuck 18 or attachment of deposition, and the plasma may be in an abnormal state that is not suitable for the plasma processing. In addition, an abnormal wafer W may be loaded into the plasma processing apparatus 10.

Therefore, the alert part 102e issues an alert based on the heat input amount calculated by the parameter calculator 102c in a predetermined cycle or a change in the heat input amount. For example, the alert part 102e issues an alert when the heat flux $q_{p\_on}$ calculated by the parameter calculator 102c in a predetermined cycle is out of a predetermined allowable range. In addition, the alert part 102e issues an alert when the heat flux $q_{p\_on}$ calculated by the parameter calculator 102c in a predetermined cycle changes beyond a predetermined allowable value. Such an alert may be of any type as long as it can notify, for example, the process manager or the manager of the plasma processing apparatus 10 of the abnormality. For example, the alert part 102e displays a message informing the abnormality on the user interface 103.

Thus, the plasma processing apparatus 10 according to the present embodiment can notify occurrence of an abnormality when the state of plasma becomes abnormal due to, for example, the characteristics of the processing container 12 or loading of an abnormal wafer W.

The changing part 102f changes control parameters of the plasma processing based on the information indicating the plasma density distribution so that the plasma processing on wafers W is equalized.

Figure 12:
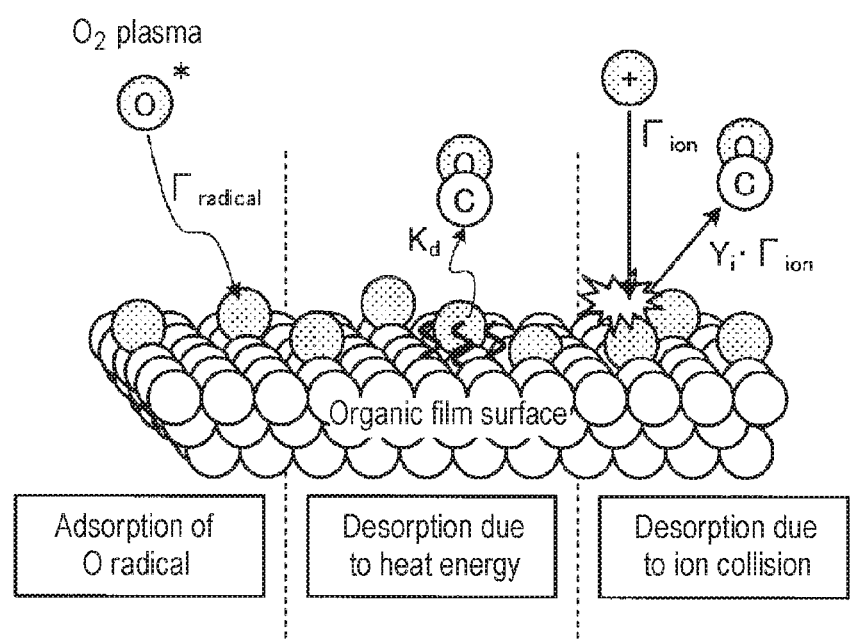
FIG. 12 is a view schematically illustrating a plasma etching process.

Here, a plasma etching process includes factors such as surface adsorption of radicals, desorption due to thermal energy, and desorption due to ion collision. FIG. 12 is a view schematically illustrating a plasma etching process. The example of FIG. 12 is a model of a state in which a surface of an organic film is plasma-etched by using $O_2$ gas. The surface of the organic film is etched by the synergistic effect of adsorption of O radicals, desorption due to thermal energy, and desorption due to ion collision.

The etching rate (E/R) of the plasma etching process can be expressed by the following Equation (14).

$$E/R = \frac{1}{n_c} \cdot \frac{1}{\frac{1}{K_d + kE_i \cdot \Gamma_{ion}} + \frac{1}{s \cdot \Gamma_{radical}}} \quad (14)$$

Here, $n_c$ is a value indicating material of a film to be etched.
$\Gamma_{radical}$ is a supply amount of radicals.
s is an adsorption probability on a surface.
$K_d$ is a thermal reaction rate.
$\Gamma_{ion}$ is an amount of incidence of ions.
$E_i$ is ion energy.
k is a reaction probability of ionic desorption.

In Equation (14), the component of "$K_d$" represents desorption due to thermal energy. The component of "$kE_i \cdot \Gamma_{ion}$" represents desorption due to ion collision. The component of "$s \cdot \Gamma_{radical}$" represents surface adsorption of radicals.

A concentration distribution of plasma influences the desorption due to ion collision, and the component of "$kE_i \cdot \Gamma_{ion}$" in Equation (14) changes depending on the plasma concentration. The etching rate also changes depending on the component of "$K_d$" or "$s \cdot \Gamma_{radical}$". Therefore, the etching rate can be equalized by changing the component of "$K_d$" or "$s \cdot \Gamma_{radical}$" depending on the plasma density distribution. Based on the information indicating the plasma density distribution, the changing part 102f changes plasma processing control parameters that affect the components of "$K_d$" and "$s \cdot \Gamma_{radical}$" such that plasma processing on the wafers W is equalized.

For example, the component of "$K_d$" changes depending on, for example, the temperature of the wafer W. In addition, the component of "$s \cdot \Gamma_{radical}$" changes depending on concentration of a gas to be plasmarized.

The changing part 102f changes the target temperature of the temperature of the wafer W for each division region of the mounting region 18a based on the information indicating the plasma density distribution. For example, the changing part 102f changes the target temperature in a division region having a high plasma density to decrease the desorption due to thermal energy. For example, the changing part 102f reduces the target temperature. In addition, the changing part 102f changes the target temperature in a division region having a low plasma density to increase the desorption due to thermal energy. For example, the changing part 102f increases the target temperature. When the upper electrode 30 is configured such that concentration of an ejected gas can be changed for each of division regions obtained by dividing the bottom surface thereof, the changing part 102f may change the concentration of the ejected gas for each division region of the upper electrode 30 based on the information indicating the plasma density distribution. For example, the changing part 102f reduces the gas concentration in a division region having a high plasma density. Further, the changing part 102f increases the gas concentration in the division region having a low plasma density. The changing part 102f may change the target temperature of the temperature of the wafer W for each division region as well as the concentration of the ejected gas for each division region of the upper electrode 30.

The set temperature calculator 102g calculates, for each heater HT, the set temperature of the heater HT at which the wafer W reaches the target temperature by using the calculated heat input amount and thermal resistance. For example, for each heater HT, the set temperature calculator 102g substitutes the calculated heat flux $q_{p\_on}$ and the calculated thermal resistance $R_{th} \cdot A$ into Equations (5), (6), and (12). Then, for each heater HT, the set temperature calculator 102g calculates the temperature $T_h$ of the heater HT at which the temperature of the wafer W reaches the target temperature from Equation (12) by using $a_1$, $a_2$, $a_3$, $\lambda_1$, $\lambda_2$, $\tau_1$, and $\tau_2$ represented in Equations (5) to (11). For example, the set temperature calculator 102g sets the elapsed time t as a predetermined value large enough to be regarded as a steady state and calculates the temperature $T_h$ of the heater HT at which the temperature Tw of the wafer W reaches the target temperature. The calculated temperature $T_h$ of the heater HT is a temperature of the heater HT at which the temperature of the wafer W reaches the target temperature. The temperature $T_h$ of the heater HT at which the temperature of the wafer W reaches the target temperature may be obtained from Equation (13).

In addition, the set temperature calculator 102g may calculate the temperature Tw of the wafer W at a current temperature $T_h$ of the heater HT from Equation (12) in the following manner. For example, the set temperature calculator 102g calculates, at the current temperature $T_h$ of the heater HT, the temperature Tw of the wafer W in a case in which the elapsed time t is set to a predetermined value which is large enough to be regarded as a steady state. Subsequently, the set temperature calculator 102g calculates a difference ΔTw between the calculated temperature Tw and the target temperature. Then, the set temperature calculator 102g may calculate the temperature obtained by subtracting the difference ΔTw from the current temperature $T_h$ of the heater HI as the temperature of the heater HI at which the temperature of the wafer W reaches the target temperature.

The set temperature calculator 102g corrects the set temperature of each heater HT in the heater controller 102a to the temperature of the heater HT at which the temperature of the water W reaches the target temperature.

The set temperature calculator 102g corrects the set temperature of each heater HT by calculating the temperature of the heater HT at which the temperature of the wafer W reaches the target temperature, in a predetermined cycle. For example, in each time when the wafer W is exchanged, the set temperature calculator 102g calculates the temperature of the heater HT at which the temperature of the wafer W reaches the target temperature, and corrects the set temperature of each heater HT. In addition, for example, for each plasma processing, the set temperature calculator 102g may correct the set temperature of each heater HT by calculating the temperature of the heater HT at which the temperature of the wafer W reaches the target temperature.

Thus, the plasma processing apparatus 10 according to the present embodiment can control the temperature of the wafer W during the plasma processing to the target temperature with high accuracy.

[Flow of Control]

Figure 13:
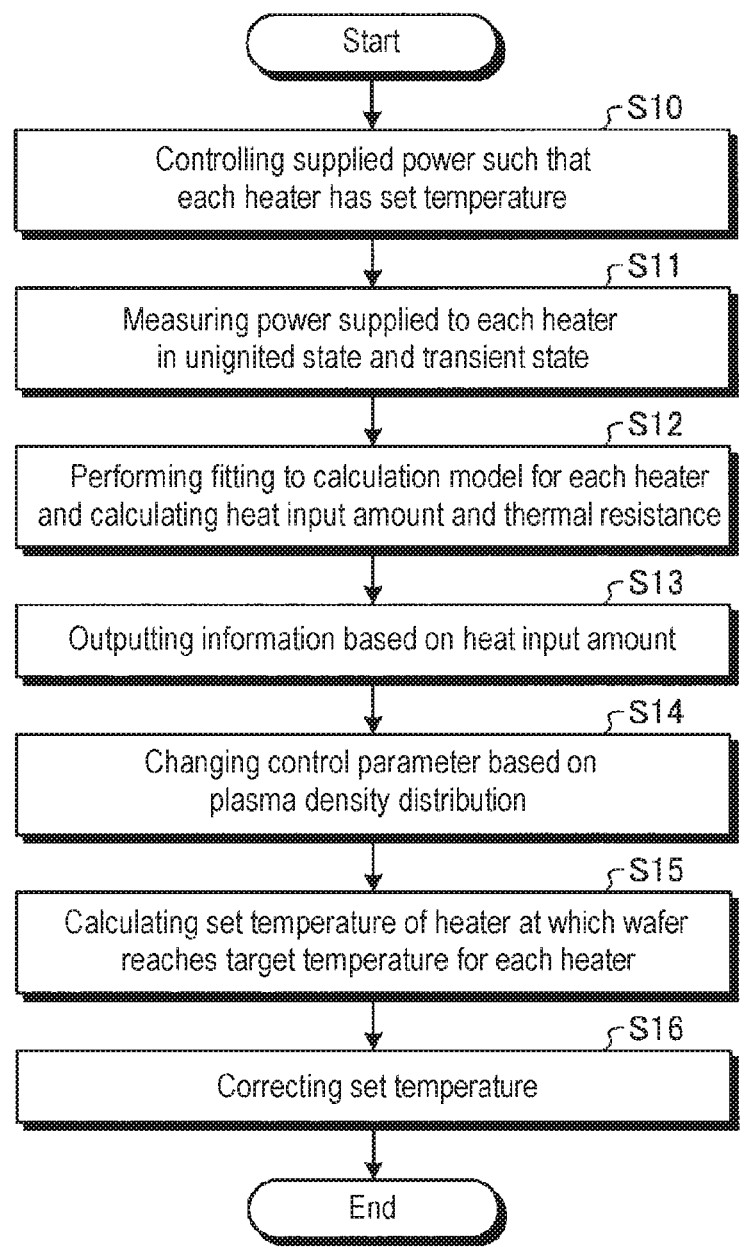
FIG. 13 is a flowchart illustrating an exemplary flow of plasma state detection and plasma state control according to an embodiment.

Next, a plasma state detection method using the plasma processing apparatus 10 according to the present embodiment will be described. FIG. 13 is a flowchart illustrating an exemplary flow of a process of plasma state detection and plasma state control according to an embodiment. The process is executed at a predetermined timing, for example, the timing of starting the plasma processing.

The heater controller 102a controls the power supplied to each heater HT such that each heater HT has a set temperature (step S10).

In the state in which the heater controller 102a controls the power supplied to each heater HT such that the temperature of each heater HT reaches a predetermined set temperature, the measurement part 102b measures the power suppled to each heater HT in the unignited state and the transient state (step S11).

The parameter calculator 102c calculates, for each heater HT, the heat input amount and the thermal resistance by performing fitting with respect to a calculation model using a heat generation amount per unit area from the heater HT, which is obtained by dividing the power supplied and measured in the unignited state and the transient state by the area of the heater HT (step S12). For example, the parameter calculator 102c calculates the heat flux $q_{p\_on}$ and the thermal resistance $R_{th} \cdot A$, which minimize an error, by performing, for each heater HT, fitting of the heat generation amount per unit area $q_{h(t)}$ from the heater HT for each elapsed time t and the heat generation amount per unit area $q_{h\_off}$ from the heater HT, by using Equations (1) to (11) described above as a calculation model.

The output part 102d outputs information based on the heat input amount calculated by the parameter calculator 102c (step S13). For example, the output part 102d outputs information indicating plasma density distribution to the user interface 103 based on the heat flux $q_{p\_on}$ for each heater HT calculated by the parameter calculator 102c.

The changing part 102f changes control parameters of the plasma processing based on the information indicating the plasma density distribution such that the plasma processing on the wafer W is equalized (step S14). For example, the changing part 102f changes the target temperature for the temperature of the wafer W for each division region of the mounting region 18a based on the information indicating the plasma density distribution.

The set temperature calculator 102g calculates, for each heater HT, the set temperature of the heater HT at which the wafer W reaches the target temperature by using the calculated heat input amount and thermal resistance (step S15). For example, for each heater HT, the set temperature calculator 102g substitutes the calculated heat flux $q_{p\_on}$ and the calculated thermal resistance $R_{th} \cdot A$ into Equations (5), (6), and (12). Then, for each heater HT, the set temperature calculator 102g calculates the temperature $T_h$ of the heater HT at which the temperature Tw of the wafer W reaches the target temperature from Equation (12) by using $a_1, a_2, a_3, \lambda_1, \lambda_2, \tau_1$, and $\tau_2$ represented in Equations (5) to (11). In addition, the temperature $T_h$ of the heater HT at which the temperature of the wafer W reaches the target temperature may be obtained from Equation (13).

The set temperature calculator 102g corrects the set temperature of each heater HT in the heater controller 102a to the temperature of the heater HT at which the temperature of the wafer W reaches the target temperature (step S16), and terminates the processing (step S16).

As described above, the plasma processing apparatus 10 according to the present embodiment includes the stage 16, the heater controller 102a, the measurement part 102b, the parameter calculator 102c, and the output part 102d. The stage 16 is provided with the heater HT capable of adjusting the temperature of a mounting surface on which the wafer W is placed. The heater controller 102a controls the power supplied to the heater HT such that the heater HT has the set temperature. The measurement part 102b controls the power supplied to the heater HT by using the heater controller 102a such that the temperature of the heater HT becomes constant, and measures the power supplied in the unignited state in which plasma is not ignited and the transient state in which the power supplied to the heater HT decreases after the plasma is ignited. The parameter calculator 102c performs fitting on a calculation model, which includes an amount of heat input from the plasma as a parameter, for calculating the power supplied in the transient state by using the power supplied in the unignited state and the transient state and measured by the measurement part 102b, and calculates a heat input amount. The output part 102d outputs information based on the heat input amount calculated by the parameter calculator 102c. Thus, the plasma processing apparatus 10 according to an embodiment can detect the state of plasma without disposing a sensor in the processing container 12.

In addition, in the plasma processing apparatus 10 according to the present embodiment, the heater HT is individually provided for each division region of the mounting surface of the stage 16. The heater controller 102a controls supplied power for each heater HT such that the heater HT provided in each region has a temperature set for a corresponding region. The measurement part 102b controls the supplied power for each heater HT by using the heater controller 102a such that the temperature becomes constant for each heater HT, and measures the power supplied in the unignited state and the transient state for each heater HT. The parameter calculator 102c performs, for each heater HI, fitting with respect to the calculation model by using the power supplied in the unignited state and the transient state and measured by the measurement part 102b, and calculates a heat input amount for each heater HT. The output part 102d outputs information indicating plasma density distribution based on the heat input amount for each heater HT calculated by the parameter calculator 102c. Thus, the plasma processing apparatus 10 can provide information indicating the plasma density distribution during the plasma processing without disposing a sensor in the processing container 12.

The plasma processing apparatus 10 according to the present embodiment further includes the changing part 102f. The changing part 102f changes the control parameters of the plasma processing based on the plasma density distribution such that the plasma processing on the wafer W is equalized. Thus, the plasma processing apparatus 10 can equalize the plasma processing on waters W.

The plasma processing apparatus 10 according to the present embodiment further includes the alert part 102e. The alert part 102e issues an alert based on the information output by the output part 102d or a change in the information. Thus, the plasma processing apparatus 10 can issue an alert when an abnormality occur in the plasma state.

Although the embodiments have been described above, it should be considered that the embodiments disclosed herein are illustrative and are not restrictive in all respects. Indeed, the embodiments described above can be implemented in various forms. In addition, the embodiments described above may be omitted, replaced, or modified in various forms without departing from the scope and spirit of the claims.

For example, in the embodiments described above, a case in which plasma processing is performed on a semiconductor wafer as a workpiece has been described as an example, but the present disclosure is not limited thereto. Any workpiece may be applied as long as it influences a progress of the plasma processing depending on a temperature. The workpiece may be, for example, a glass substrate.

In the embodiments described above, a case where a plasma etching process is performed as the plasma processing has been described as an example, but the present disclosure is not limited thereto. The plasma processing may be any processing as long as it uses plasma. For example, the plasma processing may include a chemical vapor deposition (CVD) process, an atomic layer deposition (ALD) process, an ashing process, a plasma doping process, a plasma annealing process, and the like.

Further, in the embodiments described above, the plasma processing apparatus 10 includes the base 20 to which the first high-frequency power supply HFS for plasma generation and the second high-frequency power supply LFS for bias power are connected, but the present disclosure is not limited thereto. The first high-frequency power supply HFS for plasma generation may be connected to the upper electrode 30 via a matcher MU.

In addition, in the embodiments described above, the plasma processing apparatus 10 is a capacitively coupled parallel plate plasma processing apparatus, but the embodiments may be adopted in any plasma processing apparatus. For example, the plasma processing apparatus 10 may be any type of plasma processing apparatus, such as an inductively coupled plasma processing apparatus or a plasma processing apparatus that excites a gas by surface waves such as microwaves.

In the embodiments described above, a case in which the changing part 102f changes the target temperature for the temperature of the wafer W for each division region of the mounting region 18a based on the information indicating the plasma density distribution has been described as an example, but the present disclosure is not limited thereto. For example, in a case of a configuration in which the plasma density distribution in plasma generation is changeable for each division region of the bottom surface of the upper electrode 30 or for each division region that is approximated, the changing part 102f may change the plasma density for each division of plasma generation based on the information indicating the plasma density distribution. In the case of a capacitively coupled parallel plate plasma processing apparatus, the configuration in which the plasma density distribution is changeable for each division region may be, for example, a configuration in which the upper electrode 30 is divided for each division region and a plurality of first high-frequency power supplies HFS capable of generating different high-frequency powers is connected to respective division regions of the upper electrodes. In the case of the inductively coupled plasma processing apparatus, a configuration in which an antenna for plasma generation is divided for each division region and a plurality of first high-frequency power supplies HFS capable of generating different high-frequency powers is connected to respective division regions of the antenna may be applied.

In the embodiments described above, a case in which a heater HT is provided in each of the division regions obtained by dividing the mounting region 18a of the stage 16 has been described as an example, but the present disclosure is not limited thereto. One heater HT may be provided for the entire mounting region 18a of the stage 16, the power supplied to the heater HT in an unignited state and a transient state is measured, and fitting of measured results may be performed with respect to a calculation model so as to calculate the heat input amount. Since the calculated heat input amount is the amount of heat input from the entire plasma, it is possible to detect the state of entire plasma from the calculated heat input amount.

Figure 14:
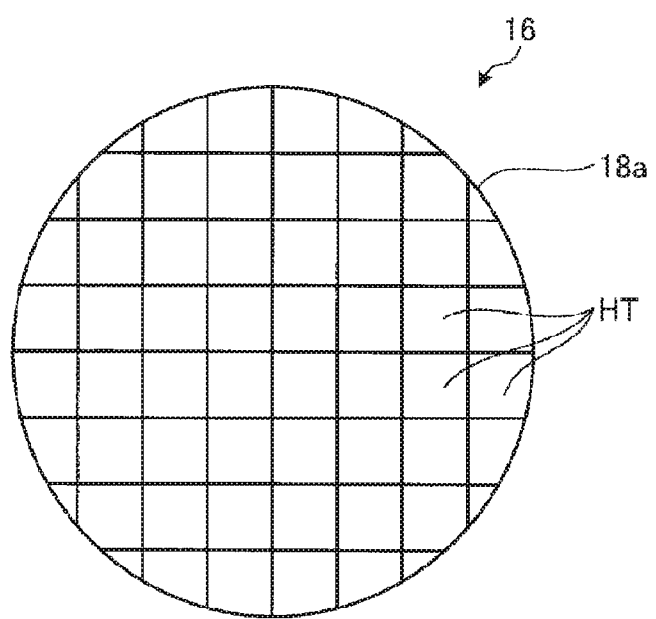
FIG. 14 is a plan view illustrating exemplary division of a mounting surface of a stage according to an embodiment.

Further, in the embodiments described above, as illustrated in FIG. 2, a case in which the mounting region 18a of the stage 16 is divided into a central circular region and a plurality of concentric annular regions surrounding the circular region has been described as an example, but the present disclosure is not limited thereto. FIG. 14 is a plan view illustrating exemplary division of a mounting surface of a stage according to an embodiment. For example, as illustrated in FIG. 14, the mounting region 18a of the stage 16 may be divided in a grid shape, and a heater HT may be provided in each division region. Thus, it is possible to detect a heat input amount for each of the grid-shaped division regions and plasma density distribution can be obtained in more detail.

EXPLANATION OF REFERENCE NUMERALS

10: plasma processing apparatus, 16: stage, 18: electrostatic chuck, 18a: mounting region, 20: base, 100: controller, 102: process controller, 102a: heater controller, 102b: measurement part, 102c: parameter calculator, 102d: output part, 102e: alert part, 102f: changing part, 102g: set temperature calculator, HP: heater power supply, HT: heater, PD: power detector, TD: temperature measurement device, W: wafer

What is claimed is:
1. A plasma processing apparatus comprising:
a stage provided with a heater configured to adjust a temperature of a mounting surface on which a workpiece as an object to be plasma-processed is placed;
a memory storage; and
a process controller configured to:
control power supplied to the heater such that the heater has a set temperature; measure the power supplied in an unignited state in which plasma is not ignited and a transient state of the plasma in which the power supplied to the heater decreases after the plasma is ignited, while the power supplied to the heater is controlled such that a temperature of the heater becomes constant;
calculate a heat input amount from the plasma by using the power measured in the unignited state and in the transient state to perform fitting on a calculation model for calculating the power supplied in the transient state;
output, on a user interface, information indicating a degree of plasma density of a region of the mounting surface where the heater is provided, by using the calculated heat input amount from the plasma, wherein the degree of plasma density corresponds to the calculated heat input amount from the plasma; and change a control parameter of plasma processing based on the information indicating the degree of plasma density of the region of the mounting surface where the heater is provided such that the plasma processing on the workpiece is uniform.

2. The plasma processing apparatus of claim 1, wherein, in the stage, the heater is individually provided for each of a plurality of division regions of the mounting surface,
wherein the process controller is further configured to:
control the power supplied for each heater such that the heater provided for each of the division regions has another set temperature set for each of the division regions,
measure the power supplied in the unignited state and the transient state for each heater, while the power supplied for each heater is controlled such that the temperature of each heater becomes constant,
calculate the heat input amount from the plasma for each heater by using the power measured in the unignited state and the transient state to perform, for each heater, fitting on the calculation model, and
output, on the user interface, information indicating plasma density distribution based on the heat input amount from the plasma for each heater calculated.

3. The plasma processing apparatus of claim 2, wherein the process controller is further configured to issue an alert based on the information output or a change in the information.

4. The plasma processing apparatus of claim 1, wherein the process controller is further configured to issue an alert based on the information output or a change in the information.

5. A plasma state detection method that causes a computer to execute a series of processes including:
measuring power, which is supplied to a heater provided in a stage and configured to adjust a temperature of a mounting surface on which a workpiece as an object to be plasma-processed is placed, in an unignited state in which plasma is not ignited and a transient state of the plasma in which the power supplied to the heater decreases after the plasma is ignited, while the power supplied to the heater is controlled such that a temperature of the heater becomes constant;
calculating a heat input amount from the plasma by using the power measured in the unignited state and the transient state to perform fitting on a calculation model for calculating the power supplied in the transient state;
outputting, on a user interface, information indicating a degree of plasma density of a region of the mounting surface where the heater is provided, by using the calculated heat input amount from the plasma, wherein the degree of plasma density corresponds to the calculated heat input amount from the plasma; and
changing a control parameter of plasma processing based on the information indicating the degree of plasma density of the region of the mounting surface where the heater is provided such that the plasma processing on the workpiece is uniform.

6. A non-transitory computer-readable storage medium storing a plasma state detection program that causes a computer to execute a series of processes, wherein the series of processes includes:
measuring power, which is supplied to a heater provided in a stage and configured to adjust a temperature of a mounting surface on which a workpiece as an object to be plasma-processed is placed, in an unignited state in which plasma is not ignited and a transient state of the plasma in which the power supplied to the heater decreases after the plasma is ignited, while the power supplied to the heater is controlled such that a temperature of the heater becomes constant;
calculating a heat input amount from the plasma by using the power measured in the unignited state and the transient state to perform fitting on a calculation model for calculating the power supplied in the transient state;
outputting, on a user interface, information indicating a degree of plasma density of a region of the mounting surface where the heater is provided, by using the calculated heat input amount from the plasma, wherein the degree of plasma density corresponds to the calculated heat input amount from the plasma; and
changing a control parameter of plasma processing based on the information indicating the degree of plasma density of the region of the mounting surface where the heater is provided such that the plasma processing on the workpiece is uniform.

7. The plasma processing apparatus of claim 1, wherein the process controller is further configured to correct the set temperature of the heater to a temperature at which the workpiece reaches a target temperature calculated based on the information indicating the degree of plasma density of the region of the mounting surface where the heater is provided.

8. The plasma state detection method of claim 5, further comprising: correcting the set temperature of the heater to a temperature at which the workpiece reaches a target temperature calculated based on the information indicating the degree of plasma density of the region of the mounting surface where the heater is provided.

9. The non-transitory computer-readable storage medium of claim 6, wherein the series of processes further includes: correcting the set temperature of the heater to a temperature at which the workpiece reaches a target temperature calculated based on the information indicating the degree of plasma density of the region of the mounting surface where the heater is provided.

10. The plasma processing apparatus of claim 1, further comprising:
an upper electrode disposed above the stage and configured to eject a gas; and
wherein the process controller is further configured to change a concentration of the ejected gas for a region of the upper electrode based on the information indicating the degree of plasma density of the region of the mounting surface where the heater is provided.

11. The plasma state detection method of claim 5, further comprising: changing a concentration of an ejected gas, from an upper electrode disposed above the stage, for a region of the upper electrode based on the information indicating the degree of plasma density of the region of the mounting surface where the heater is provided.

12. The non-transitory computer-readable storage medium of claim 6, wherein the series of processes further includes: changing a concentration of an ejected gas, from an upper electrode disposed above the stage, for a region of the upper electrode based on the information indicating the degree of plasma density of the region of the mounting surface where the heater is provided.

* * * * *